(12) United States Patent
Trusov et al.

(10) Patent No.: US 8,368,154 B2
(45) Date of Patent: Feb. 5, 2013

(54) THREE DIMENSIONAL FOLDED MEMS TECHNOLOGY FOR MULTI-AXIS SENSOR SYSTEMS

(75) Inventors: Alexander Trusov, Irvine, CA (US); Montgomery C. Rivers, Irvine, CA (US); Sergei A. Zotov, Irvine, CA (US); Andrei M. Shkel, McLean, VA (US)

(73) Assignee: The Regents of the University of California, Oakland, CA (US)

( * ) Notice: Subject to any disclaimer, the term of this patent is extended or adjusted under 35 U.S.C. 154(b) by 246 days.

(21) Appl. No.: 13/024,112
(22) Filed: Feb. 9, 2011

(65) Prior Publication Data
US 2012/0032286 A1 Feb. 9, 2012

Related U.S. Application Data

(60) Provisional application No. 61/305,462, filed on Feb. 17, 2010.

(51) Int. Cl.
*H01L 29/84* (2006.01)
*H01L 21/02* (2006.01)

(52) U.S. Cl. ........................................... 257/417

(58) Field of Classification Search .......... 257/678–733, 257/787–796, E23.001–E23.194, E25.031–E25.032, 257/E23.042, 100, 433, 434, 667, E31.117–E31.118, 257/E51.02, E23.116–E23.14, 668, 620, 257/737, 777, E23.172, E29.324, E21.613, 257/417, E21.002; 438/6, 28, 67, 107, 109, 438/406, 455–459, 113
See application file for complete search history.

(56) References Cited

U.S. PATENT DOCUMENTS

2012/0063137 A1* 3/2012 Livesay et al. ........... 362/249.02

* cited by examiner

*Primary Examiner* — Dao H Nguyen
*Assistant Examiner* — Tram H Nguyen
(74) *Attorney, Agent, or Firm* — Marcus C. Dawes; Daniel L. Dawes

(57) ABSTRACT

An apparatus is fabricated with a plurality of semiconductor-device substrates and/or MEMS substrates with micromachined sensors, circuits, transducers, and/or MEMS devices fabricated on the plurality of substrates. A plurality of flexible hinges couple the plurality of substrates into a substantially flat two dimensional foldable assembly. Electrical interconnects coupled to the sensors, circuits, transducers, and/or MEMS devices extend other ones of the plurality of substrates. The foldable assembly of substrates is assembled or folded into a three dimensional polyhedral structure with the plurality of substrates configured in three dimensions to form defined relative orientations in space with respect to each other. The invention includes a wafer scale method of fabricating the apparatus.

24 Claims, 25 Drawing Sheets

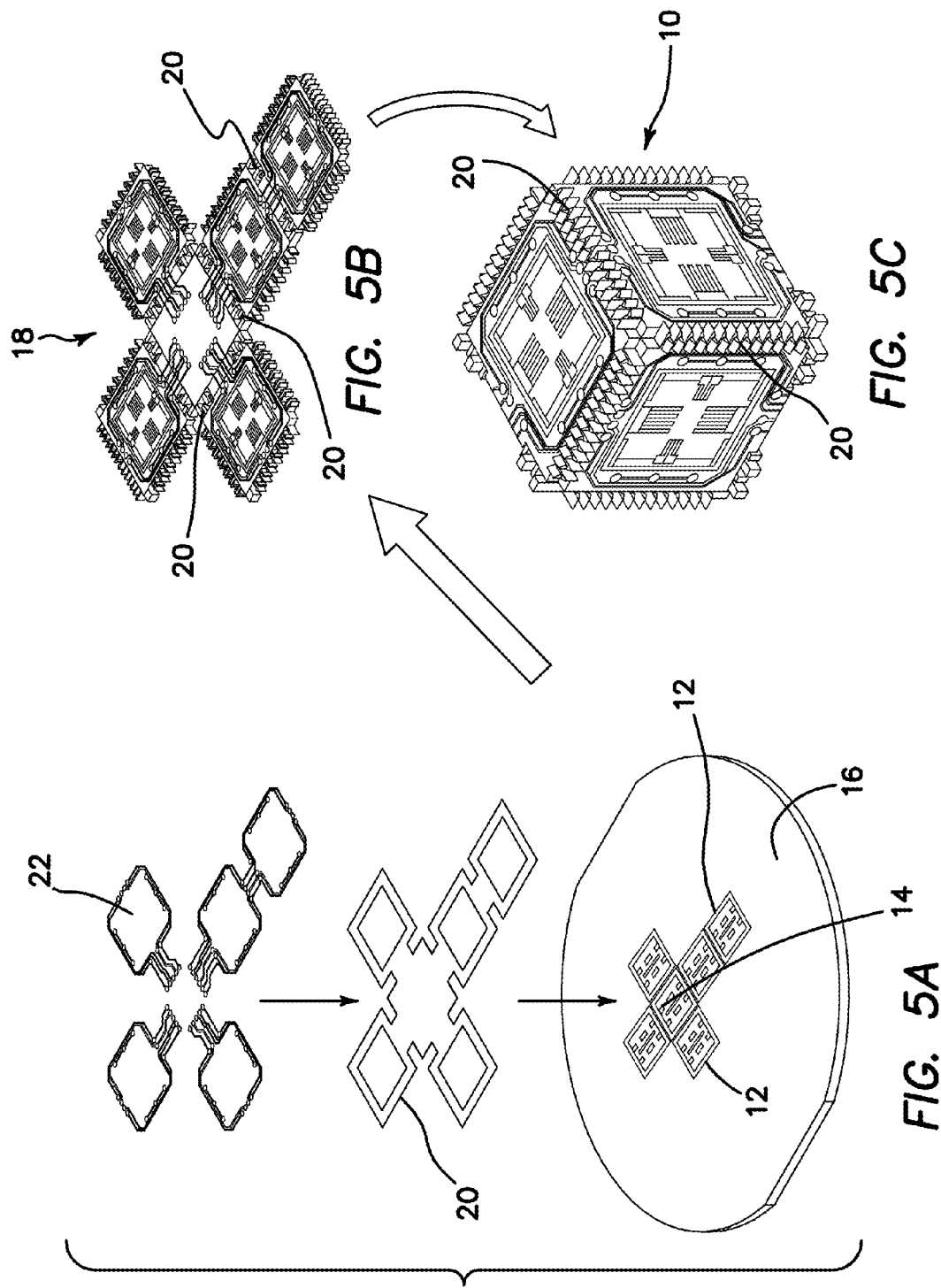

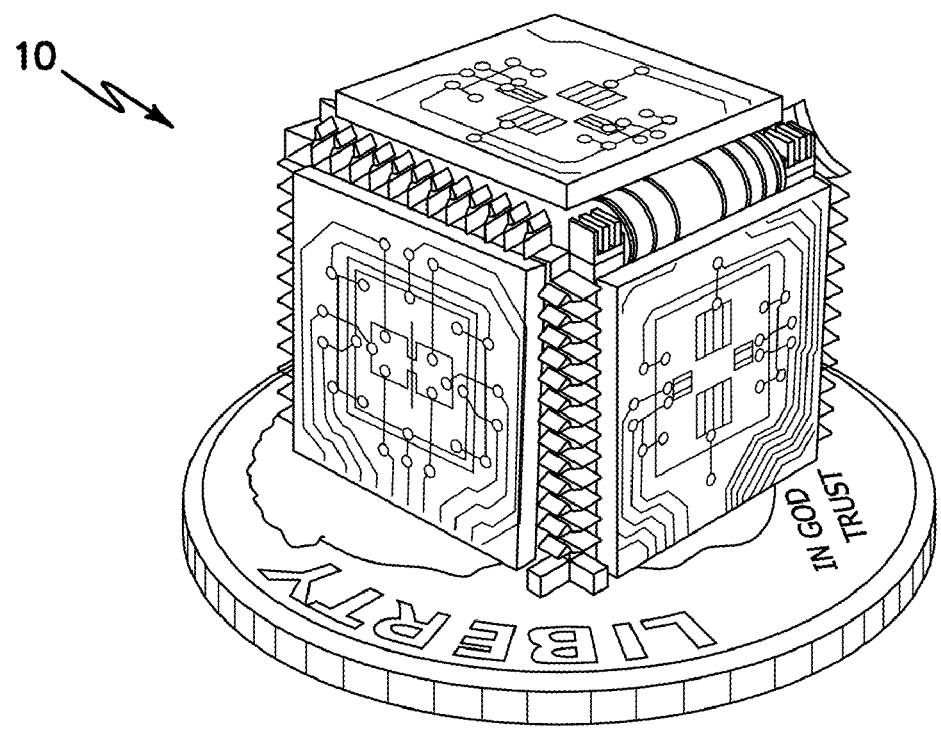
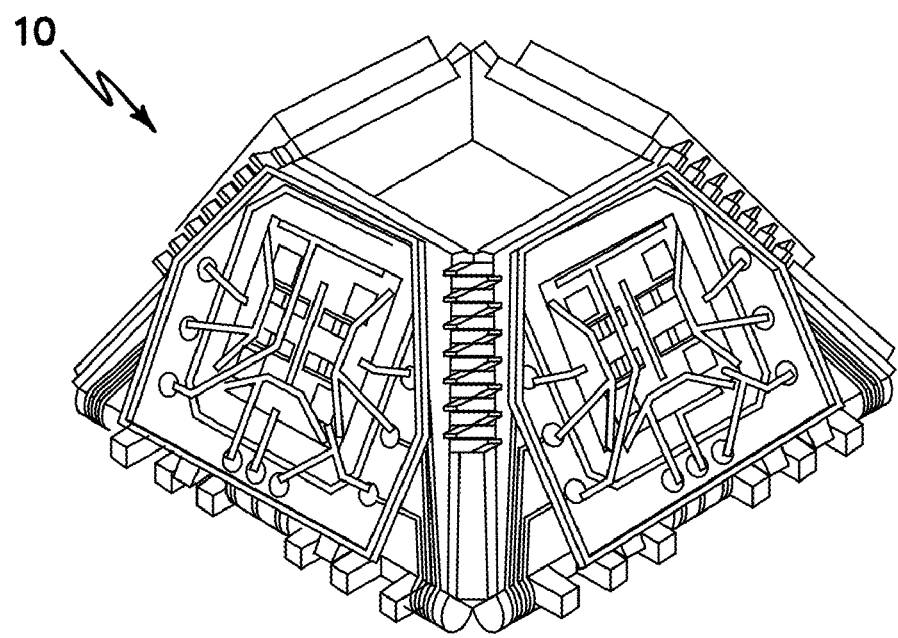
*FIG. 15*

THREE DIMENSIONAL FOLDED MEMS TECHNOLOGY FOR MULTI-AXIS SENSOR SYSTEMS

RELATED APPLICATIONS

The present application is related to U.S. Provisional Patent Application, Ser. No. 61305462, filed on Feb. 17, 2010, which is incorporated herein by reference and to which priority is claimed pursuant to 35 USC 119.

STATEMENT OF GOVERNMENT SUPPORT

This invention was made with Government support under grant number W31P4A-08-1-0008, awarded by the United States Army. The Government has certain rights in this invention.

BACKGROUND OF THE INVENTION

1. Field of the Invention a. The invention relates to the field of an apparatus and fabrication of MEMS, inertial measurement unit (IMU), three dimensional packaging, micromachined inertial sensor and its microfabrication.

2. Background

As the demand grows for miniaturization of sophisticated equipment, technological advances in microfabrication are constantly being developed. For instance, integrated circuits have enabled millions of transistors to be built on a single die capable of processing billions of instructions per second. More currently, MEMS and nanotechnology have given birth to a new era of fabrication. Due to the fast growth of both fields, interest for miniaturization is being expressed by an increasing number of applications. A large portion of current research is focused on development of transducers. Multiple sensors measuring different phenomena are generally desired to be very compact, simplifying integration. Moreover, many applications such as inertial measurement, ultrasonic devices, and optical sensing benefit from measurement along multiple axes. To address the needs of current and future applications, a novel approach of creating a chip-level system of micro machined sensors (or transducers) capable of detection (or transduction) along three independent axes has been developed.

One application for such a device is inertial measurement. Fields such as defense, space exploration, navigation, and personal entertainment are showing a rising interest for a complete inertial measurement unit (IMU) capable of measuring rotation and acceleration along three independent axes. Another application is multi-axis pressure sensing. A miniature three dimensional microphone could be used to monitor audio signals with the ability to precisely detect the source location of individual sounds, or to detect all sound in three dimensions. Ultrasonic devices could be built to transmit and receive sonar signals for underwater exploration or communication. Video surveillance purposes could benefit from a three dimensional camera that minimizes the number of cameras needed to fully observe the surroundings. For applications requiring very low-power consumption such as space exploration or remote navigation, a lightweight multi-axis energy scavenging device can be built to efficiently store energy induced from inertial motion. Though this is only a short list of possible applications for a compact three dimensional system of transducers and sensors, this manuscript will focus specifically on the example of a chip-level Inertial Measurement Unit (IMU).

Current methods to create a compact IMU typically fall into three general regimes. The most common approach is to use off-the-shelf sensors mounted onto PCBs and assembled into a three dimensional configuration. A conceptual version of this is shown in FIG. 1 where a three dimensional structure can measure rotation rate and accelerometer if provided with a sensor PCB module on each sidewall of a cubic sensor structure. With this method, separately packaged, single-axis sensors are typically used which are optimized for performance and rejection of cross-axis inputs.

Therefore the overall IMU benefits from better performance compared to using multi-axis sensors. Also, current technology supports this approach as PCB manufacturing and assembly is a very mature and well-known process. However, major drawbacks do exist. First, significant PCB-level assembly of individual components is necessary. For this reason, alignment errors will vary for each device, requiring extensive calibration of each individual unit before use. Additionally, the device is inherently not very compact. While units developed currently are small (on the order of 1-2 $in^3$), there is no clear path for further miniaturization and reduction of power consumption.

An alternative method used to create a chip-level IMU, shown in FIG. 2, is to fabricate all sensors onto a single die. This allows the footprint of the system as a whole to be small enough for chip-level packaging. Lithographic alignment also reduces the difficulty of post-fabrication calibration because the sensors are all nearly orthogonal to each other. Despite these advantages, there are significant drawbacks to this IMU architecture. First, creating sensors for in-plane and out-of-plane detection requires very different design parameters. For both to coexist on the same substrate, a compromise in fabrication complexity and sensor performance must be made to accommodate multiple axes on the same substrates. It is often that the in-plane and out-of-plane sensors are created with mixed technologies, such as a combination of bulk and surface micromachining, sacrificing performance in some axes.

Another emerging method for creating micro IMUs involves chip-stacking as shown in FIG. 3. Each sensor is fabricated independently and then known-good dies are stacked together onto a single chip. In comparison to the PCB and common substrate approaches, the overall size of the IMU is reduced to a footprint equal to that of one sensor. Also, because each die is fabricated independently of the stack, signal detection electronics can also be included in the stack to create a self-contained chip-scale system of sensors. However, there are drawbacks to this approach as well. In most cases, both in-plane and out-of-plane sensors are included because of the stack geometry. Because the sensors are created with different processes, they are not identical in design and suffer from mismatched sensitivities between the in-plane and out-of-plane devices. Another challenge with this method is minimizing electrical crosstalk. Due to the large number of interconnects that are required to pass through the bottom chip, significant parasitic capacitance exists which induces noise and degrades IMU performance.

BRIEF SUMMARY OF THE INVENTION

The illustrated embodiment achieves the advantages of existing techniques, while additionally eliminating many of the challenges. The basis of the design includes sensors that are fabricated on a single substrate, and then assembled at the wafer-level into a three dimensional spatial arrangement. To accomplish this, a folding structure is fabricated on the same substrate as the sensors, and can be assembled into a cube, pyramid, or other polyhedral shapes with sensors contained on each sidewall. This allows for integration of high-performance single-axis sensors capable of measuring acceleration and rotation in three dimensions. Package size is reduced to <1 cm³, yet provides similar or greater performance than that of the larger devices and tighter integration for improved Size Weight, and Power (SWaP).

The illustrated embodiments are directed to a chip-level system of sensors utilizing a wafer-level folding backbone containing sensors on each sidewall. Initially, development toward a micro IMU has been done using MEMS accelerometers and gyroscopes. Many challenges have been addressed, including mechanical and electrical design, structural rigidity, vacuum packaging, and sensor modularity. Features included within the design of the folded structure include inertial sensors, flexible hinges with fingers to prevent lateral motion, interlocking latches that provide rigidity and alignment, and electrical interconnects. Together this set of components provides many advantages over current miniaturization techniques.

Fabrication was done using the proposed process to provide high aspect ratio sensors, polyimide hinges, and gold electrical interconnects. Folded IMU cubes have been created, and pyramidal structures were also developed due to the higher inherent structural integrity. Both types of structures result in a footprint of less than cm², compact enough for chip-level packaging. Sensors are packaged by wire bonding or by means of attaching lids with pre-fabricated metal traces to the electrical interconnects. Assembly of the devices is done by folding the sidewalls together and latching them into place, creating a self-contained chip-level IMU.

For maximum rigidity and robustness to thermal variation, a method for welding together backbone panels (including silicon and glass substrates) has been shown to be feasible. Bulk silicon welding techniques provide the required rigidity for an inertial sensing platform, and are being developed along with glass-to-glass fusion of backbone panels. Wafer-level vacuum packaging has also been conceptualized, which is advantageous to the folded structure due to the capability of packaging sensors at various pressures. Additionally, it is shown that a wide variety of sensors can be integrated into the cube for different application requirements. Overall, a new paradigm for bringing MEMS from two dimensions to three dimensions using wafer-level folded structures to create miniature, tightly integrated systems of transducers is proven to be feasible.

A wafer-level approach for fabrication and three dimensional integration of MEMS devices in miniature multi-axis assemblies of inertial, acoustic, and optical transducers and sensors is disclosed. The approach is based on parallel fabrication of individual devices on a single substrate connected by flexible electrical interconnects, mechanical hinges and latches. A multi-axis transducer system is then obtained by folding the fabricated structures into three dimensional cubes, pyramids, or other rigid shapes, and subsequently reinforced with eutectic solder or micro-welded for maximum rigidity. In the illustrated embodiment, the feasibility of a folded MEMS approach for creation of a miniature collection of high performance sensors and actuators is shown. The illustrated embodiment is described in the context of a micro Inertial Measurement Unit (IMU) capable of accurate measurement of acceleration and rotation rate along three independent axes. However, it is to be expressly understood that the invention may be embodied in many other types of devices other than those specifically illustrated. The number of such illustrations is virtually limitless and no finite disclosure could include all that could or might be devised. Design of the IMU comprises a folded cube or pyramid backbone structure with micromachined accelerometers and gyroscopes on its sidewalls. Silicon-on-insulator (SOI) or silicon-on-glass (SOG) wafers are used as a substrate for fabrication of both the inertial sensors and the folded structures. Fabrication of the sensors consists of photolithography, deep reactive ion etching (DRIE), and hydrofluoric acid (HF) acid release of the inertial proof masses. Flexible polymer hinges connecting faces of the folded structures are defined on the same substrate and incorporate electrical interconnects. To provide rigidity to the assembled three dimensional structure, interlocking silicon latches are fabricated along the edges of each sidewall, which are silicon-to-silicon (or, respectively, glass-to-glass) welded after assembly. Packaging of the folded MEMS system has been demonstrated using flip-chip solder bumping, as well as flip-chip epoxy bonding methods. Feasibility testing was done using a one-mask fabricated interconnect plate with bond pads that mate to those on the bottom of the folded structure.

Packaging of individual sensors requires further consideration. For instance, different types of sensors require packaging at varied levels of pressure. To mitigate this challenge, wafer-level vacuum packaging is necessary. For this reason, vacuum sealing lids have been designed that include getters patterned on the center of each lid. To encapsulate the different types of sensors, the lids are sealed at individual pressures. Using different eutectic solder compositions, the higher vacuum devices can be packaged first, followed by sealing of devices requiring lower vacuum pressures. Using an SOI or SOG substrate to fabricate the folded MEMS structures, the approach is highly modular. Not only can the invention be used to create an IMU, it can also be used to create a wide variety of transducers. Examples of which include a three dimensional microphone, multi-axis ultrasonic transceivers, CCD cameras, or energy scavengers. In general, any micromachined device can be integrated into the folded structure for various applications.

More specifically, the illustrated embodiments of the invention include an apparatus comprising a plurality of semiconductor-device substrates and/or MEMS substrates, at least one micromachined sensor fabricated on one of the plurality of substrates, a plurality of flexible hinges coupling the plurality of substrates into a substantially flat two dimensional foldable assembly, and electrical interconnects coupled to the sensor and extending to at least one other one of the plurality of substrates. The foldable assembly of substrates is assembled into a three dimensional polyhedral structure with the plurality of substrates configured in three dimensions to form defined relative orientations in space with respect to each other.

The substrates have edges and further include latches defined on selected ones of the edges for engaging each other so that the three dimensional polyhedral structure is substantially rigid.

The apparatus further includes at least one integrated circuit fabricated in one of the plurality of substrates.

In one embodiment the three dimensional polyhedral structure comprises a cube, and in another it comprises a pyramidal structure.

In one embodiment the apparatus includes soldered seams, fused seams, or epoxied seams on selected ones of the edges so that the three dimensional polyhedral structure is substantially rigid.

In one embodiment the apparatus includes multiple accelerometers to provide a six-axis inertial measurement unit (IMU).

In various embodiments the plurality of substrates includes a silicon-on-insulator (SOI) substrate, a silicon-on-glass (SOG) substrate, or a dissolved silicon-on-glass (SOG) substrate.

In one embodiment the apparatus further includes a device fabricated with SOI, SOG, or IC techniques where the device includes an accelerometer, gyroscope, transducer, pressure sensor, resonator, signal detection circuit, energy scavenger, a three dimensional microphone or ultrasonic device capable of measuring or sending signals along at least one axis.

In one embodiment the apparatus further includes a vibration isolation system integrally fabricated with the three dimensional polyhedral structure.

In one embodiment the apparatus further includes a vacuum sealing lid disposed on the sensor during fabrication. The apparatus may further include CMOS integrated circuitry on either the top or bottom of the lid to provide co-located signal processing for the sensor.

In one embodiment the apparatus further includes an embedded three dimensional polyhedral structure fabricated within the three dimensional polyhedral structure, the embedded three dimensional polyhedral structure including at least one sensor or device to provide advanced functionality including self-calibration, detection of multiple phenomena, or additional CMOS signal processing.

The illustrated embodiments of the invention also include within their scope a method comprising the steps of fabricating at a wafer level a plurality of semiconductor device and/or MEMS substrates wherein at least one micromachined sensor is fabricated on one of the plurality of substrates, wherein a plurality of flexible hinges coupling the plurality of substrates into a substantially flat two dimensional foldable assembly is fabricated; and wherein an electrical interconnect coupled to the sensor and extending to at least one other one of the plurality of substrates is fabricated, and assembling or folding the plurality of substrates into a three dimensional polyhedral structure with the plurality of substrates being configured in three dimensions to form defined relative orientations in space with respect to each other.

In one embodiment the steps of fabricating and folding the plurality of substrates into a three dimensional polyhedral structure include providing multiple accelerometers and gyroscopes to provide a chip-level six-axis inertial measurement unit (IMU).

In one embodiment the step of fabricating the plurality of substrates into a three dimensional polyhedral structure comprises fabricating a plurality of silicon-on-insulator (SOI) substrates, silicon-on-glass (SOG) substrates or dissolved silicon-on-glass (SOG) substrates.

In one embodiment the method fabricates the flexible hinges and electrical interconnects around the sensor, and releases them by etching through the entire corresponding substrate in which the sensor is defined.

In one embodiment the method further includes fabricating a plurality of devices with identical techniques into the plurality of substrates to reduce performance variance between devices resulting from fabrication imperfections.

In one embodiment the method further includes fabricating a plurality of sensors in-situ in two or more of the plurality of substrates when configured as the substantially flat two dimensional foldable assembly, so that all the sensors among the plurality of substrates are photolithographically aligned, thereby minimizing output errors.

In one embodiment where three dimensional polyhedral structure is composed of silicon or compounds of silicon the method further includes silicon-to-silicon welding selected ones of the sidewall edges of the substrates together to maximize rigidity of the structure and prevent thermal expansion effects.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112. The invention can be better visualized by turning now to the following drawings wherein like elements are referenced by like numerals.

BRIEF DESCRIPTION OF THE DRAWINGS

FIG. 5 is a fabrication process flow diagram of the three dimensional MEMS structure of FIG. 4.

14a is a perspective diagram of the flat foldable inside surfaces of the pyramidal structure. FIG. 14b is a perspective diagram of the flat foldable outside surfaces of the pyramidal structure. FIG. 14c is a perspective diagram of the three dimensional folded pyramidal structure in assembled form.

FIG. 15 is a pair of photographs of a cubic and pyramidal folded structure after fabrication and assembly with encapsulation lids containing electrical interconnects to the flexible circuit.

FIG. 19b is a microphotograph showing the bonding pads and wire bonded interconnects for coupling to metal traces on the bottom of the IMU of FIG. 19a.

Figure 1:
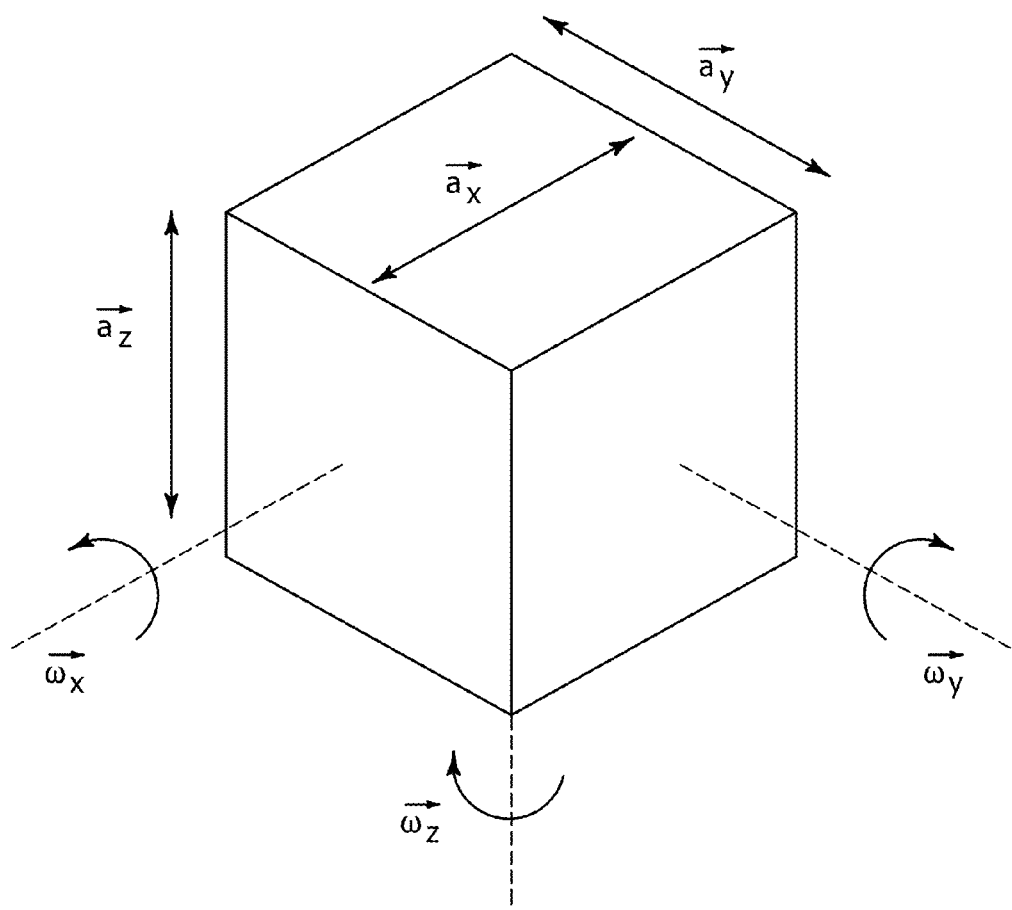
FIG. 1 is a diagram of the prior art three dimensional approach in which separate sensors are mounted on different planes of a structure.
Figure 2:
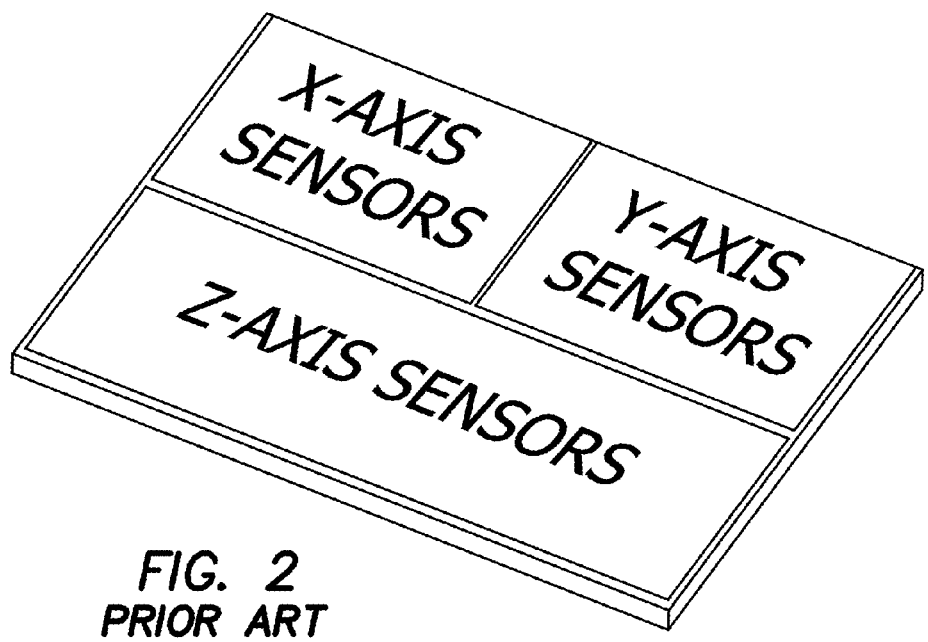
FIG. 2 is a diagram of the prior art approach in which sensors for motion in different directions are fabricated in a single planar chip or array.
Figure 3:
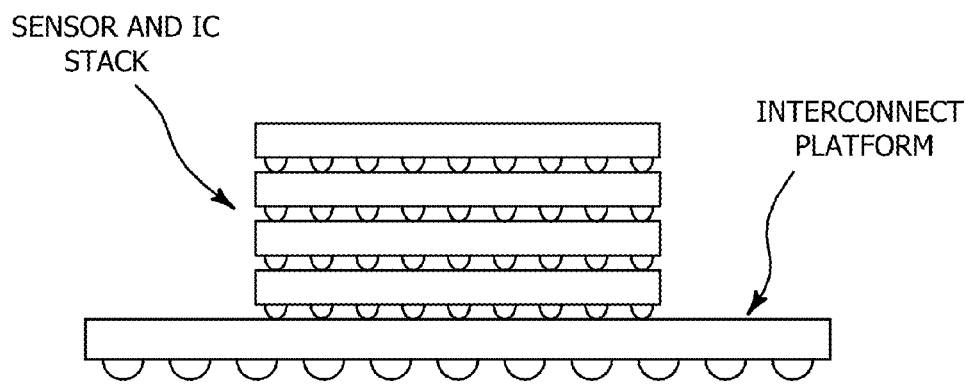
FIG. 3 a diagram of the prior art approach in which multiple sensors and IC, each fabricated in planar chips are stacked vertically onto an interconnect platform.
Figure 4:
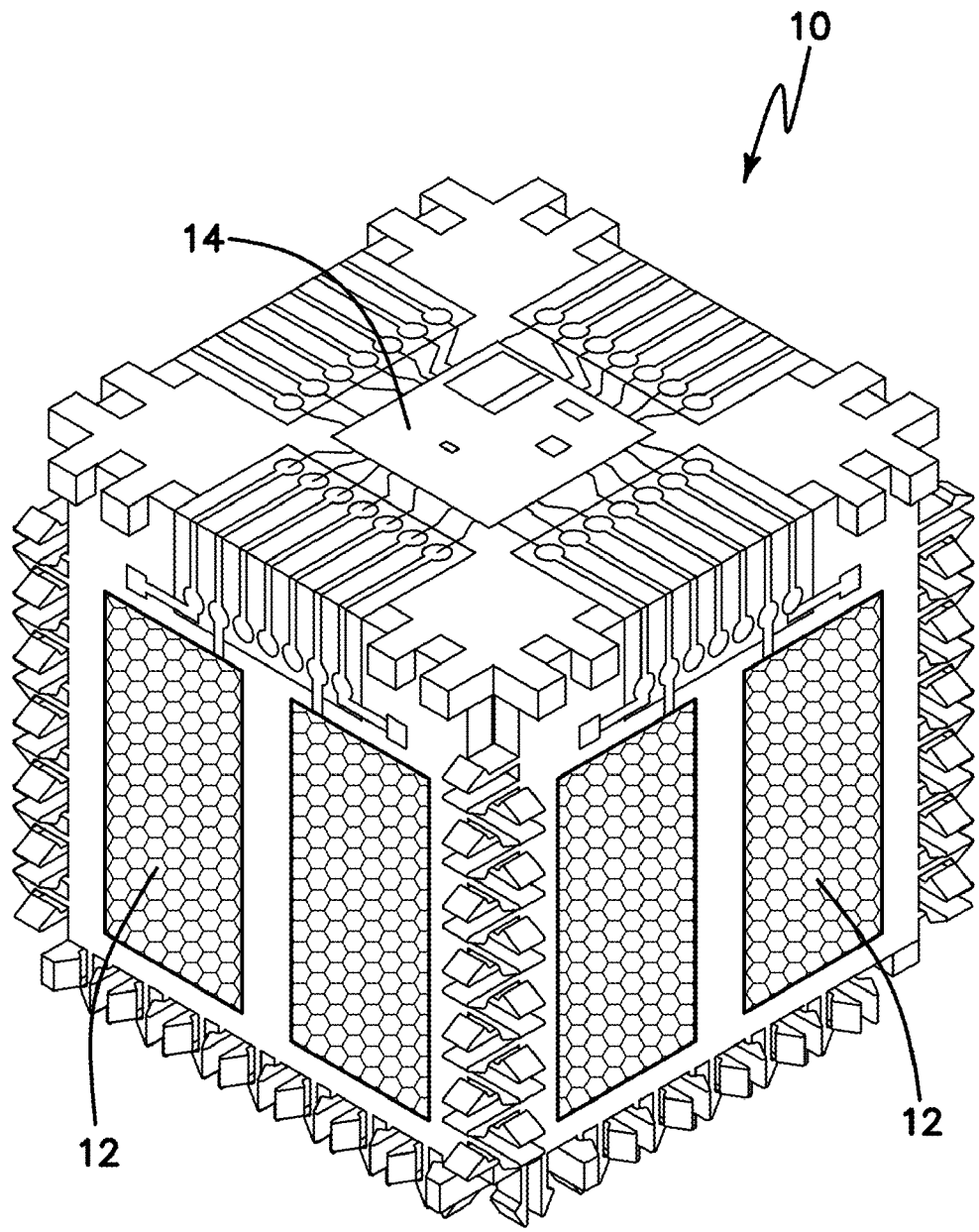
FIG. 4 is a conceptual diagram of the three dimensional foldable device of the illustrated embodiments of the invention with integrated CMOS circuitry.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENTS

The illustrated embodiments of the invention include a wafer-level folding structure 10 with micromachined transducers or sensors 12 on each or selected sidewalls that, when assembled, forms a rigid, compact three dimensional structure 10, which is electrically and mechanically interconnected with one or more integrated circuits 14. The three dimensional folding of a multi-axis structure 10 is implemented to achieve complete single-wafer integration of high-performance transducers and sensors 12 on a sturdy three dimensional backbone. Using microfabrication techniques for creating the subcomponents of the design allows for very compact implementation of a system containing multiple transducers and sensors 12.

Several different types of transducers 12 can be used, including resonator clocks, resonant chemical sensors, optical and electrical switches, inertial sensors, and the like allowing for a wide variety of possible applications. The listing of the types of transducers and sensors 12 which could be included is nearly limitless and no closed list could ever be provided. For instance, a combination of ultra-high-Q single-crystal silicon gyroscopes, accelerometers, and a resonator clock can be used to form a 6-axis IMU with embedded timing capabilities. Another possibility is a set of pressure transducers for acoustic measurement or ultrasonic communication. Inclusion of the sensors 12 is designed to be done by fabricating them on the same substrate as the folding structure itself. However, sensors 12 can also be fabricated independently and then mounted onto the sidewalls.

The overall idea of folded SOI MEMs or IC fabrication is shown in FIGS. 5a-5c. A substrate disc 16 has fabricated therein the sensors 12 or other MEMS or IC devices 14 as may be desired as further detailed in the method of the illustrated embodiment discussed below in connection with FIGS. 9a-9j, including the inclusion therein of flexible hinges 20 and metal traces 22. A one-piece assembly or integral, foldable flat 18 or three dimensional structure 10 results and is released from substrate disc 16 as shown in FIG. 5b. Structure 10 is folded on a plurality of flexible hinges 20, described in greater detail in FIG. 8 to form the folded three dimensional structure 10 according to the illustrated embodiment of the invention as shown in FIG. 5c.

Due to the modularity of the folded structure 10, sensors 12 can be fabricated using a wide variety of techniques. One method, which is a well understood conventional process, is to use Silicon-on-Insulator (SOI) substrates 16 comprised of two silicon wafers bonded together through a layer of silicon dioxide. Alternatively, another conventional process which can be exploited is Silicon-on-Glass (SOG) or, more specifically, dissolved wafer microfabrication approaches. Transducers and sensors 12 are etched into the device layer formed in the substrate 16 and due to the oxide film formed in these conventional processes, are electrically insulated from each other. Micromechanical portions of the device, such as proof masses (not shown), are freed from the substrate 16 by etching the underlying oxide, while anchored components remain attached as shown below in connection with the method of FIGS. 6a-6c.

Figure 6A:
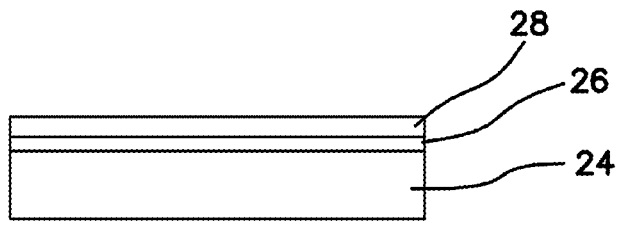
FIGS. 6a-6e are flow diagrams of a method of fabricating sensors included on the structure of FIGS. 4 and 5 using a silicon-on-insulator process.
Figure 6B:
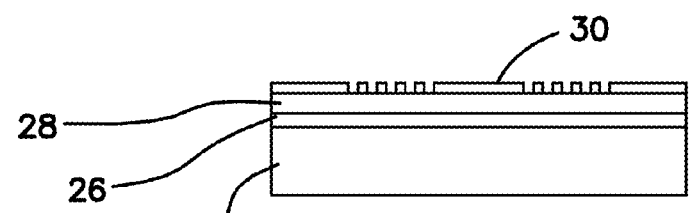

FIG. 6a illustrates the preparation of SOI substrate 16, namely a handle layer 24 of silicon, an insulating silicon dioxide layer 26 and thin silicon device layer 28. To create the SOI devices, a selectively patterned etch mask 30 is first applied, as shown in FIG. 6b. Materials for the mask can vary, but must maintain a high etch selectivity when compared to etching silicon, preferably above a 50:1 ratio. Current techniques include the use of photoresist, silicon dioxide, titanium dioxide, and silicon nitride. Other materials have also been developed and are currently being researched for various applications. The mask 30 is created by depositing a thin film of etch-resistant material (not shown), and then removing undesired portions by use of photolithography and etching. For a photoresist mask 30, chemical development is used to define device features. Photoresist is generalized into two types: negative and positive. Negative photoresist experiences polymer cross-linking when exposed to light, causing the unexposed portions to be dissolved faster in the developer solution. The resulting mask is a negative of the exposure image used. Conversely, positive photoresist is dissolved more easily after being exposed, leaving a positive image of the exposure image. Either technique can be used for SOI fabrication, assuming that the exposure mask is designed appropriately.

Figure 6C:
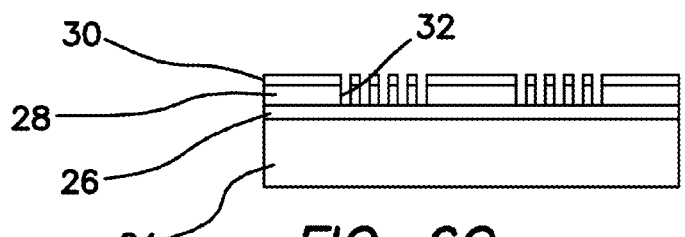

After the mask 30 is defined, a deep reactive ion etching (DRIE) step is used to create high aspect ratio features in the device layer as shown in FIG. 6c. This creates nearly vertical sidewalls 32, which is desired for reasons such as suspension design, capacitive detection, and electrostatic actuation. Other etching techniques can be used, such as traditional RIE which is an isotropic etch, or wet etchants such as potassium hydroxide. However these methods do not provide the vertical side walls 32 and high aspect ratio features optimal for fabrication of high performance devices.

Figure 6D:
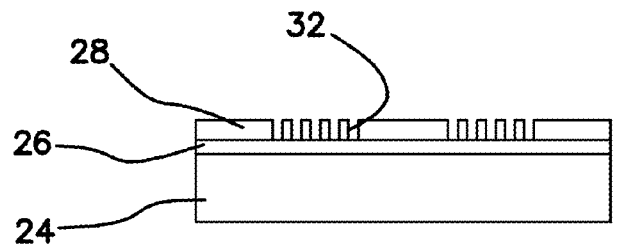

Once the device features 32 are etched entirely through the device layer 28, the mask 30 must be removed as shown in FIG. 6d. If using a soft mask such as photoresist, acetone can be used to eliminate most of the material. For additional cleansing, exposure to $O_2$ plasma is used to chemically remove leftover organic residues. If using a hard mask such as silicon dioxide or silicon nitride, acid must be used to etch away the mask 30. To remove silicon dioxide, the sample is immersed into HF, and nitric acid is used to dissolve silicon nitride. Often silicon dioxide is preferred due to the fact that it will automatically be removed while releasing the devices, requiring one less step in processing. However etch selectivity for silicon nitride is generally higher requiring a thinner mask 30.

Figure 6E:
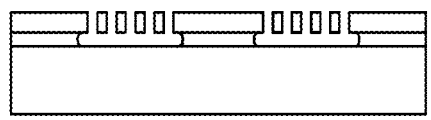

To release the moveable portions 32 of the sensors 12, the underlying silicon dioxide layer 26 is etched using HF as shown in FIG. 6e. Solutions of HF buffered with ammonia also can be used. However, due to the high surface tension of these HF mixtures, it may be necessary to add a surfactant to allow for penetration into high aspect ratio trenches. Anchored components must be designed to prevent release during this process. Since all of the underlying oxide 26 is being etched at once, anchors 34 must be large enough to survive the exposure time required for the released components. For large features that must be released, such as a proof mass 36, etch holes 38 are used to allow uniform penetration of the HF into all areas of the structure. This is a commonly used conventional method for reducing the overall etch time to prevent the anchors 34 from being released.

Figure 7:
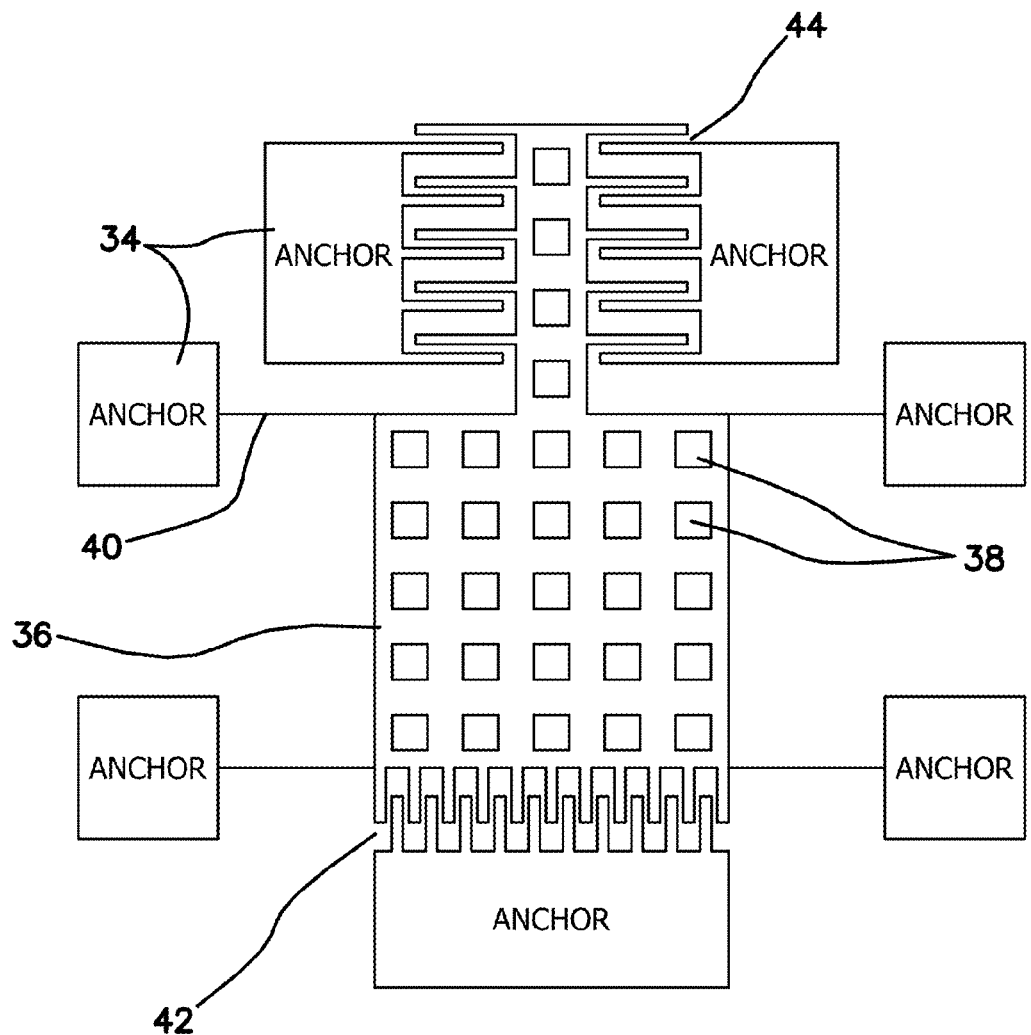
FIG. 7 is a simplified plan view diagram of the principal design features of a mechanical silicon sensor included in or on the three dimensional folded MEMS sensor structure of FIGS. 4 and 5 made using a silicon on insulator process of FIGS. 6a-6e.

Components of a silicon MEMS transducer 12 usually consist of a proof mass 36, suspension beams 40, actuators 42, and detectors 44. Several different methods can be used for creating each type of component in SOI or SOG technologies. Common methods for actuation include electrostatic forcing, piezoelectric response, and thermal response. FIG. 7 shows two typical structures capable of electrostatic actuation and detection—a comb drive and parallel plates. By applying a voltage difference between the proof mass 36 and the capacitive structures 42 or 44, displacement is induced into the proof mass 36. These structures can also be utilized as capacitive sensors 44 because any displacement of the proof mass 36 changes the overall capacitance, which can be detected with signal detection methods. In general, comb drives 42 are used for actuation, whereas parallel plates 44 are used for sensing. Other conventional techniques can also been used such as piezoresistive and optical detection.

To improve performance, balanced double-sided detection and actuation is generally performed. By placing sense electrodes 44 on both sides of the proof mass 36, the nominal capacitance is doubled, making it possible to detect smaller displacements of the proof mass 36. This improves performance of the sensor 12 by reducing the lowest level of detection. Passive devices such as pressure sensors, accelerometers, and energy scavengers greatly benefit from this technique. Double-sided design improves actuation in the same manner. More importantly, some methods of actuation can only induce force in one direction. Providing actuators 42 on both sides of the device allow for constant forcing over the full range of motion of the proof mass 36. Specifically for resonators, gyroscopes, and other active sensors this significantly improves performance.

Several challenges must be addressed in the design of the folded structure 10. Sidewalls 46 must be able to easily fold into place without damage to the hinges 20 or other components of the device. Once assembled, structural rigidity must be maintained to minimize misalignments of the sensors 12. Any alignment errors that occur during operation will induce bias into the output signals. Electrical interconnects 22 must also be provided to each sidewall 46 to allow for communication with each sensor 12. Consideration must be taken when designing the metal traces 22 to minimize impedance and electrical cross-talk between neighboring signals. An example of a possible design is shown in FIG. 8 which includes components that address each challenge.

Figure 8:
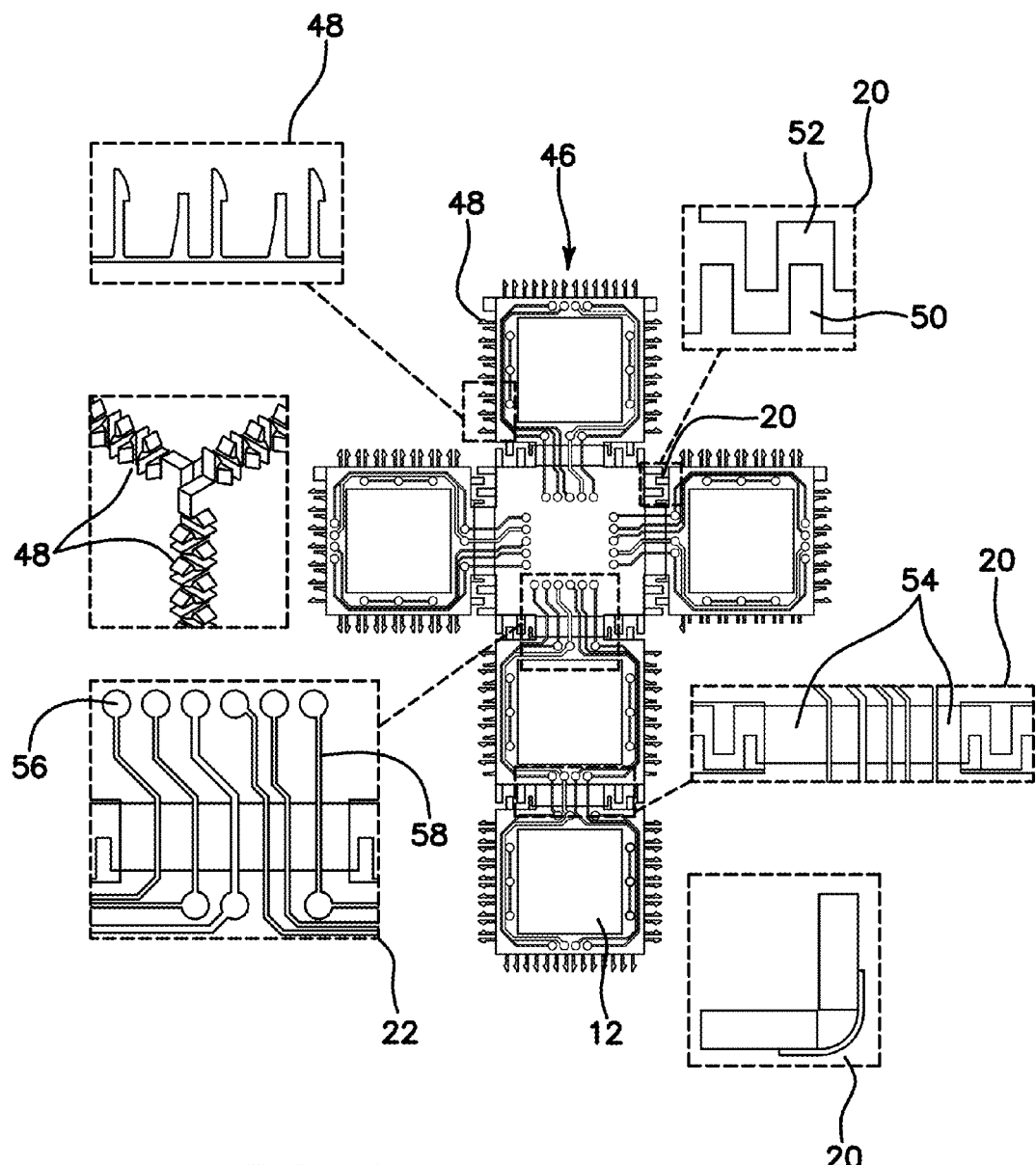
FIG. 8 is a simplified plan view diagram of a foldable structure, which is then folded into the three dimensional folded MEMS sensor structure of FIGS. 4 and 5, including a plurality of insets of enlarged depictions of selected portions of the foldable structure.

Latches 48, shown in the inset enlargement of FIG. 8, are provided on the edge of each sidewall 46 to hold the structure 10 together. By using an interlocking design, the number of latches 48 along each edge of sidewall 46 is maximized, thus providing rigidity of the overall structure. Several types of latch designs have been explored, varying in shape and size. The example shown in FIG. 8 is designed to minimized initial interference and aid in alignment of the sidewalls 46 during assembly. Other designs developed involve increasing density of latches 48, improving strength of individual latches 48, and maximizing the holding force. Once assembled, the latches 48 maintain alignment of each sensor 12, minimizing potential bias errors.

Compliant hinges 20, shown in the inset enlargement in FIG. 8, must also be provided to allow for folding the sidewalls 46 into place. These hinges 20 must allow for large-degree bending (i.e. 90° or greater) with a small radius (approximately 500 μm). Additionally, they must be able to withstand dynamic environments and be capable of carrying electrical traces or interconnects 22 with active signals. For this reason, the hinges 20 must be made of an insulating material and have a smooth surface finish suitable for metal deposition. Polyimide is a good example of a material that meets the requirements, and is currently used in the electronics industry for creating ribbon cables in compact devices.

Mechanical design of the hinges 20 include hinge fingers 50 and gaps 52 over the flexure area between sidewalls 46. Portions 54 of the hinge 20 of selected widths provide continuity of mechanical connection across the hinge 20 while allowing for flexibility. The purpose of the hinge fingers 50 is to minimize lateral movement of each sidewall 46 during assembly, aiding in alignment of the sensors 12. Once in place, the hinge fingers 50 are used to support the overall structure 10. To allow for the flexible hinge 20 to bend without tearing or breaking, the hinge gaps 52 are included to increase the bending radius of the polyimide. This prevents plastic deformation that could cause damage to the electrical interconnects 22 or the hinges 20 themselves.

In addition to mechanical design, electrical properties must also be considered. To minimize influence of outside electromagnetic interference, it is desired to have very low impedance of each individual trace 22. For the design shown in FIG. 8, all traces 22 are 60 μm wide except for the ground trace, which is 100 μm to allow for more current. In general these are quite large, yielding resistances capable of safely carrying 15-20 watts of power for the longest traces 22. Crosstalk is also a concern because of the close vicinity of neighboring signals. For this purpose, the interconnects 22 are designed to be far apart from each other except where high-density is necessary. To simplify wire bonding of the sensors 12, bond pads 56 on each sidewall 46 are located near each anchor 34 on the sensor 12. This minimizes the length of each bond wire 58 and reduces overall impedance. For packaging purposes, all interconnects 22 terminate on the bottom of the structure 10. Therefore flip-chip mounting of the device can be done directly onto a PCB, or into a larger chip-level package.

Depending on the application and type of sensors 12 implemented into the folded MEMS structure, the substrate 16 chosen for fabrication will vary. To allow for integration of sensors 12 using the process described above, an SOI or SOG substrate 16 can be used. However other types of sensors 12 may require only single crystal silicon wafers for fabrication, or another type of substrate. An example of a fabrication process for a folded structure with in-situ sensors is shown in FIGS. 9a-9j which utilizes an SOI substrate 16.

Figure 9A:
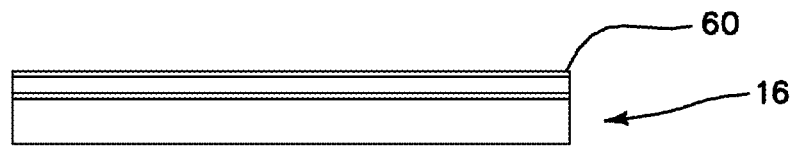
FIGS. 9a-9j are flow diagrams of the fabrication process for manufacturing the three dimensional folded MEMS sensor structure of FIGS. 4 and 5 with in-situ silicon-on-insulator transducers and sensors fabricated on the same wafer as the backbone structure.
Figure 9B:
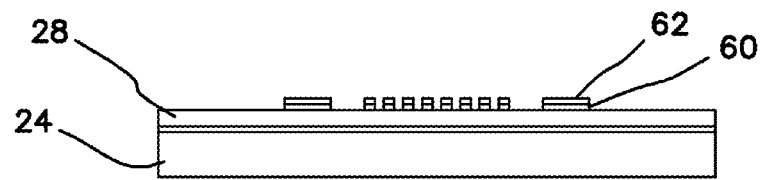

To begin fabrication, a thin film of silicon dioxide 60 is deposited on the top side (device layer 28) of the wafer 16 as shown in FIG. 9a. Many methods exist for depositing oxide including CVD, PVD, or thermal growth, all of which are compatible for this process. This layer 60 will act as a hard mask for the sensors 12, although a soft mask such as photoresist can also be used. Once the oxide layer 60 deposited, photoresist 62 is patterned to define the sensor features. Either negative or positive photoresist process can be used, however a positive resist process is shown in FIG. 9b. The portions of oxide 60 not protected by the photoresist 62 is etched away using either wet or dry techniques and the mask is removed, completing fabrication of the sensor hard mask 60.

Figure 9C:
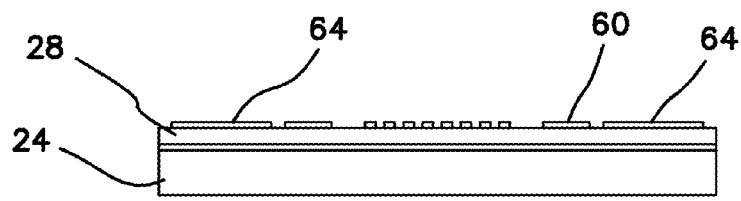
Figure 9D:
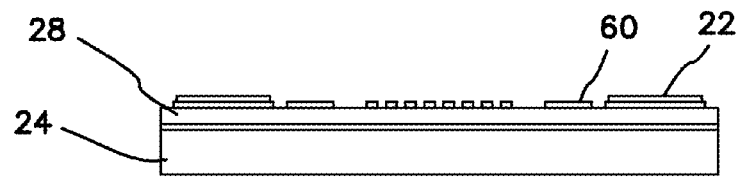

Polyimide 64 is then deposited and patterned around the areas occupied by the sensors 12 as depicted in FIG. 9c. In this example, the polyimide chosen is defined photolithographically. Other polyimides can be patterned by selective etching of a conformal film or by casting. Once the polyimide 64 is applied, deposition of metal traces 22 is done in the same manner—either etching or selective deposition as shown in FIG. 9d. In general, this is done using a lift-off process which is common to the microfabrication industry. The metal deposited consists of a thin seed layer that adheres well to the polyimide 64, followed by deposition of the desired material. For this process, a 500 angstrom layer of chromium is used as the seed layer underneath 5000 angstroms of gold. This composition is chosen due to its compatibility with conventional wedge and ball wire bonding techniques.

Figure 9E:
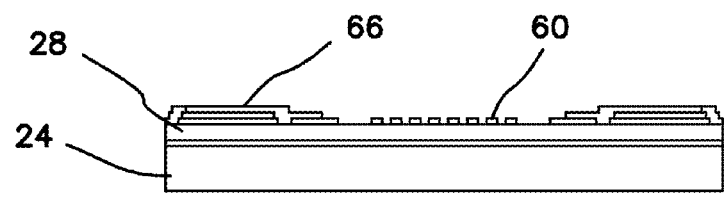
Figure 9F:
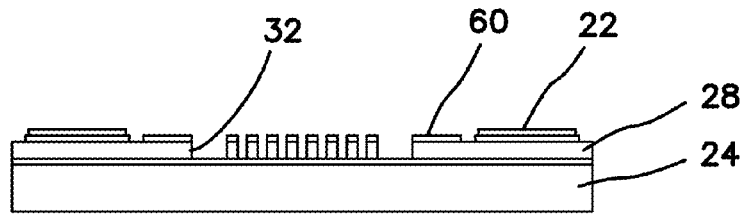

Once the polyimide 64 and metal 22 processes are completed, photoresist 66 is applied everywhere except for the sensor locations to protect the rest of the sample from etching as seen in FIG. 9e. The sensors 12 are etched using DRIE to provide vertical sidewalls 32 necessary for capacitive actuation and detection as shown in FIG. 9f. It is possible to etch the sensors 12 prior to applying polyimide 64 and metal 22, however these materials will become entangled in the high aspect ratio trenches 32, rendering the devices inoperable. Front side fabrication is finalized by removing the photoresist 66 using solvents and oxygen plasma.

Figure 9G:
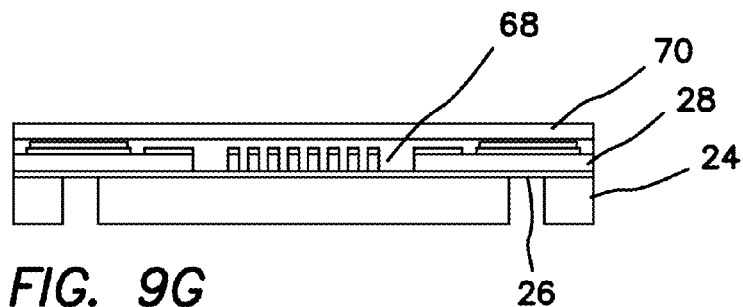
Figure 9H:
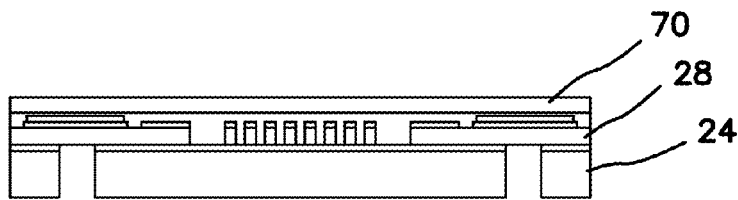
Figure 9I:
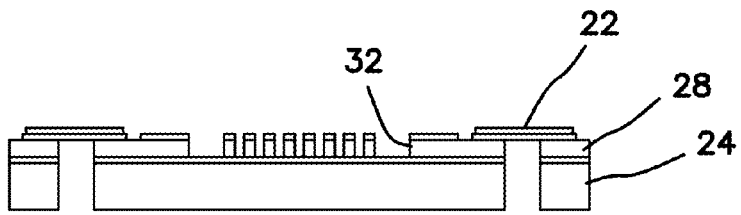

The remainder of the process involves etching through the backside of the wafer 16 to release the foldable structures. However, before processing the backside of the wafer 16, care must be taken to prevent damage of the front side features. For this reason, the front side is protected with a layer of photoresist 68 followed by a layer of protective tape 70 as shown in FIG. 9g. Once deposited, the backside of the wafer 16 is masked using either photoresist or a hard mask (not shown). Etching is done first through the bottom layer 24 (handle layer) of the wafer 16 using DRIE etching. Once the buried oxide layer 26 is reached, a different etching technique must be used to remove the oxide layer 26 such as wet etching with HF or dry etching with RIE as shown in FIG. 9h. Etching then continues through the device layer using the same DRIE process as for the handle layer 24, and the structures are released from the wafer 16 as shown in FIG. 9i.

Figure 9J:
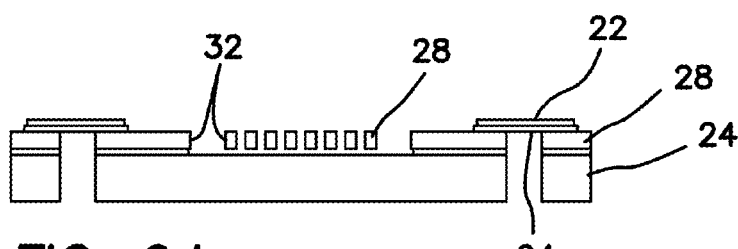

After the foldable structures 18 are removed from the wafer 16, the sensors 12 can then be released by etching the underlying oxide layer 26 as shown in FIG. 9j. As described in above, this is done by using RIE or immersion of the device into HF acid or a mixture thereof. Due to the presence of materials susceptible to damage from using HF, buffered oxide etch (BOE) is used as a replacement. Composition of BOE is comprised of HF and ammonia in varied levels of concentration. By using a buffered mixture, the polyimide and metal features are not attacked. Once the devices are fully released, packaging and assembly of the folded MEMS structure 10 can ensue, creating a compact multi-axis sensing unit.

As mentioned above, fabrication of folded MEMS systems 10 can be accomplished using a substrate different from SOI in a similar manner. One alternative method uses silicon-on-glass (SOG) sensor fabrication, with a process example shown in FIGS. 10a-10e. Fabrication begins by etching cavities 72 into a glass wafer 74 in areas that eventually will be located below mobile sensor features. Anchor areas 76 are also defined in the glass pre-etching step to allow for anodic bonding to the sensor bond pads. Metal 78 is then deposited into the glass cavity 72 to provide electrical interconnects from the sensors 12 to the enveloping folded structure. A conformal coating 80 is used to provide step-coverage across the interface from the bottom of the cavity to the non-etched areas. For the purpose of interfacing the connections with electrical vias or conductive anchors, metal 82 is patterned on top of the non-etched glass substrate 74 prior to bonding.

Figure 10A:
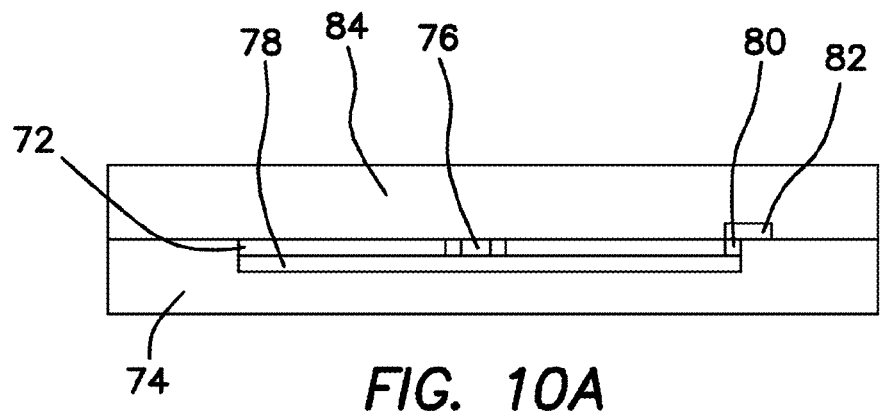
FIGS. 10a-10e are flow diagrams of the fabrication process for silicon-on-glass the three dimensional folded MEMS sensor structure of FIGS. 4 and 5.
Figure 10B:
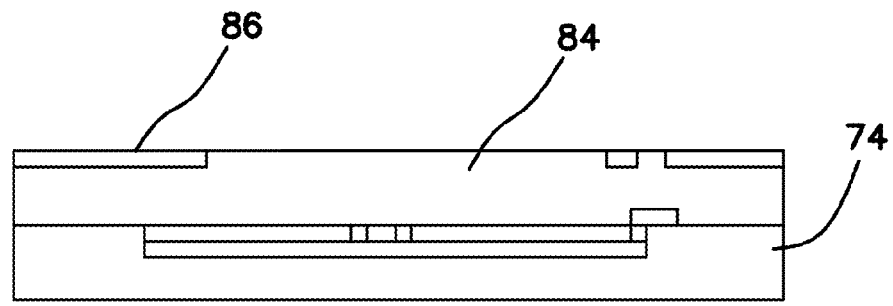
Figure 10C:
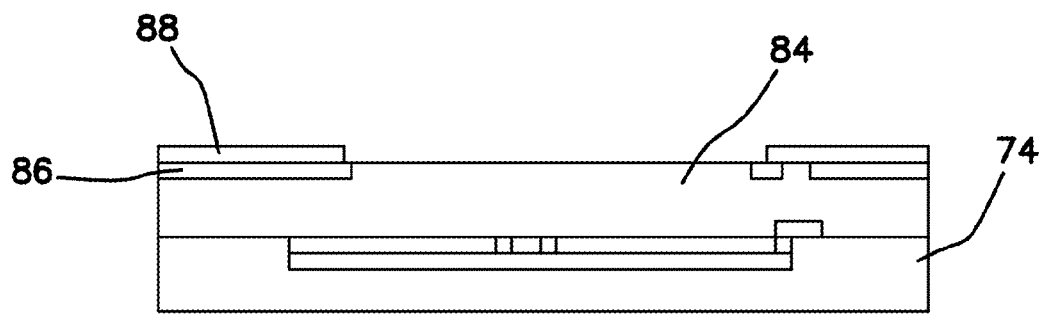
Figure 10D:
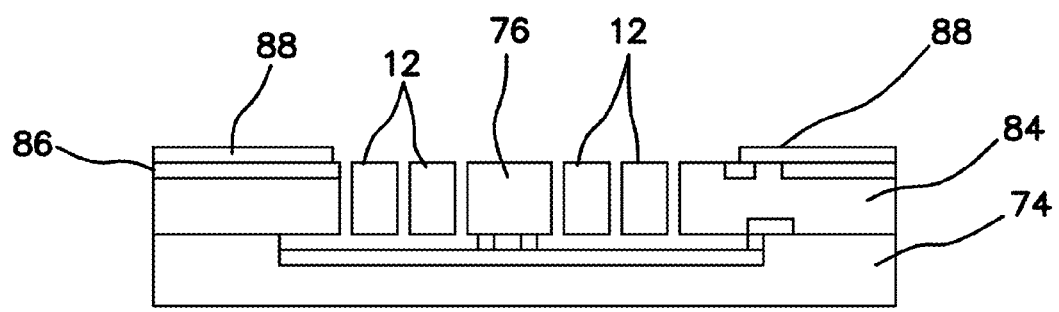
Figure 10E:
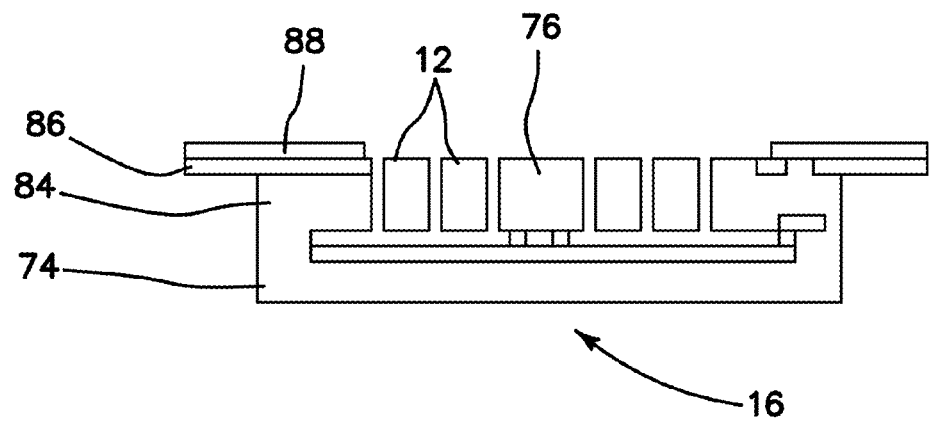

After fabrication of the glass wafer 74 is complete, a silicon wafer 84 is bonded atop the etched features as shown in FIG. 10a. Polyimide 86 is then deposited and patterned to function as the flexible hinges 20 as well as an insulating medium suitable for carrying electrical interconnects. Other materials can also be used given that the same requirements are fulfilled. The flexible hinge material 86 can be deposited on top of the silicon substrate 84, or can be integrated into the silicon wafer 84 as shown in FIG. 10b. To create a polymer layer that is embedded in the silicon wafer 84, trenches must first be etched to provide a cavity for the polymer. Application of the flexible material can be done using multiple techniques including but not limited to spin coating, lamination, and molding. To planarize the surface, the wafer is polished to create a flush interface between the silicon and the polymer as shown in FIG. 10b. Electrical interconnects 22 are then patterned on top of the polyimide 86 with metal 88 using a lift-off process as shown in FIG. 10c. Sensors 12 are then created by patterning a soft mask or hard mask followed by DRIE etching through the entire device layer as shown in FIG. 10d. To remove the folded structures from the manufactured wafer 16, etching is done from the backside through the glass 74 and silicon layers 84. Once the flexible hinge material 86 is reached, the devices are removed from the manufactured wafer 16 as shown in FIG. 10e.

Figure 11A:
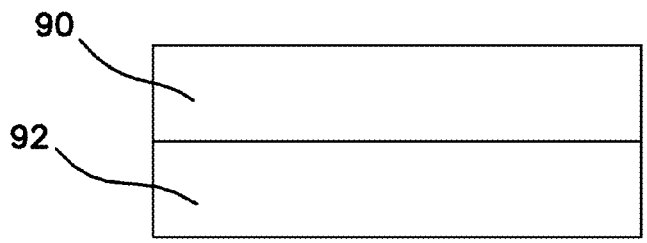
FIGS. 11a-11h are flow diagrams of the dissolved-wafer process for the three dimensional folded MEMS sensor structure of FIGS. 4 and 5.
Figure 11B:
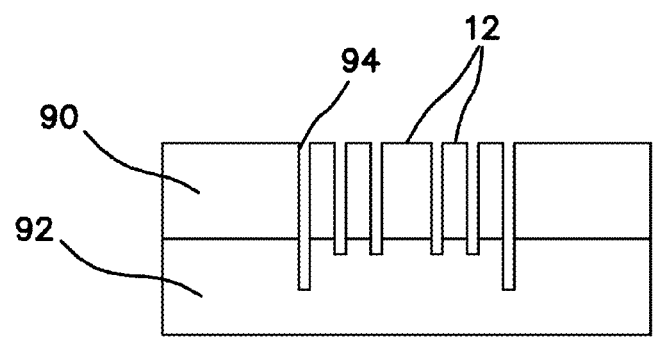

A third method for creating a folded system 10 of sensors 12 can be used with a dissolved-wafer process as shown in FIGS. 11a-11h. First a P-doped silicon wafer 90 is bonded to an N-doped silicon wafer 92 as shown in FIG. 11a. To create the sensor features, the P-doped wafer 90 is etched until all trenches 94 reach into the N-doped layer 92 as shown in FIG. 11b. Due the limited selectivity of silicon DRIE, doping does not significantly affect the etch rate of N-doped or P-doped silicon. However feature size of the etched trenches 94 creates a difference. Larger features tend to etch faster than small features, which can be problematic. When using SOI fabrication, large etch trenches 94 finish etching and reach the buried oxide layer prior to the smaller features. Therefore the large features are over-etched, causing some of the bottom portion of the silicon sensor features to be etched. This phenomenon, called "footing", causes a reduction in sensor performance and thus is not desired. By utilizing a dissolved wafer process, footing can be eliminated to allow for optimal sensor fabrication.

Figure 11C:
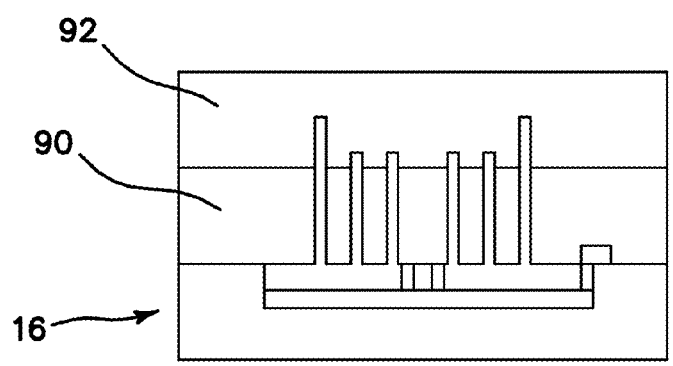
Figure 11D:
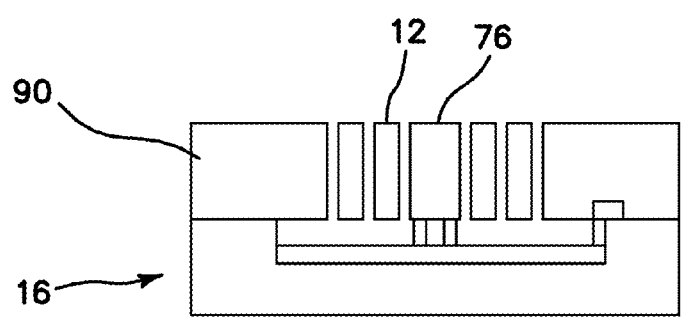

After etching the sensors 12, a glass wafer 16 with metal interconnects and encapsulation cavities as described in connection with FIGS. 10a-10e above is bonded to the P-doped silicon wafer 90 as shown in FIG. 11c. Fabrication of the glass wafer 16 is done using the same process as described for the SOG fabrication method. To finalize the fabrication of the sensors 12, the N-doped silicon wafer 92 is dissolved using ethylenediamine pyrocatechol (EDP). Etch selectivity of N-doped silicon to P-doped silicon is adequate to minimize damage to the sensor features resulting in the structure of FIG. 11d.

Figure 11E:
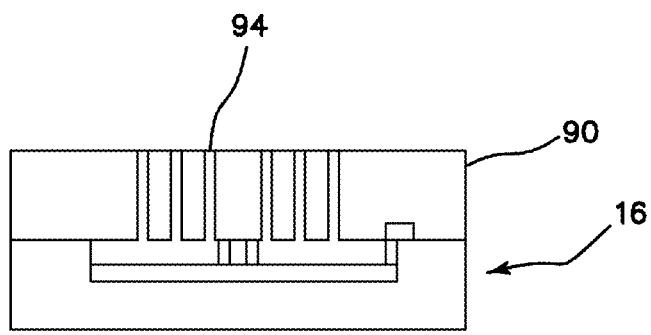
Figure 11F:
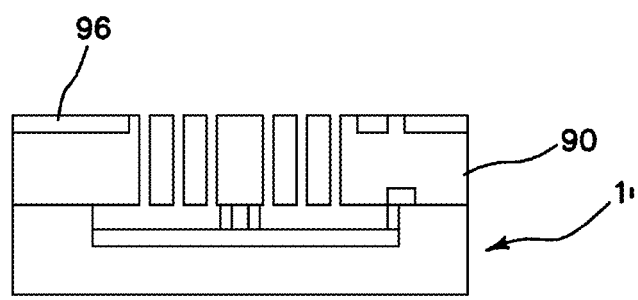
Figure 11G:
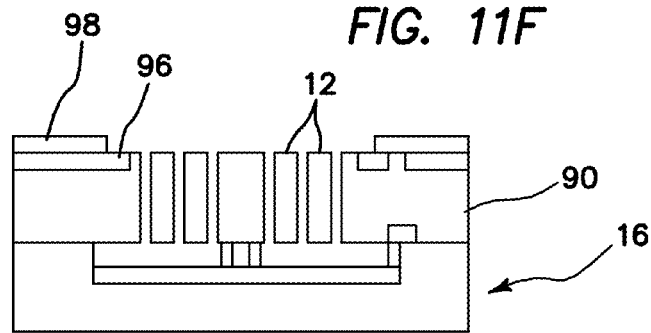
Figure 11H:
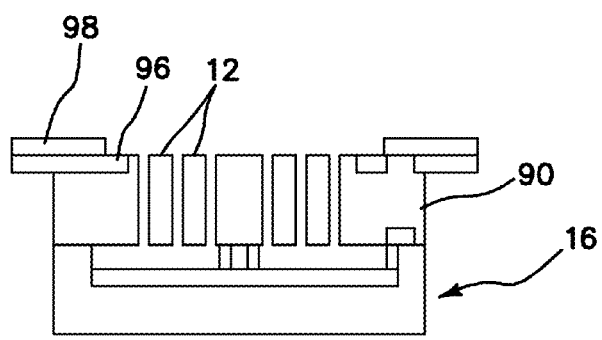

The enveloping folded MEMS structure is then fabricated around the sensors 12. To prevent damage to the sensor features during the refraining processes, a sacrificial material 94 such as photoresist is impregnated into the sensors 12. This is done using spin coating, conformal deposition, or other techniques, followed by polishing and cleansing the top surface as shown in FIG. 11e. A flexible polymer such as polyimide 96 is then deposited and patterned as shown in FIG. 11f. As described the for SOG process this can be done either by embedding the polyimide into the silicon or depositing atop the non-etched surface. Metal interconnects 98 are deposited on top of the flexible substrate using lift-off to define the electrical traces 22 from the sensors 12 to the folded MEMS structure as shown in FIG. 11g. To remove the foldable structures from the manufactured wafer, a through-etch is done from the backside as depicted in FIG. 11h. Once the polyimide layer 96 is exposed, each folded structure 18 is separated from the wafer and prepared for packaging.

Two stages of packaging exist for the folded structure. First, the sensors 12 must be wire bonded to the electrical interconnects 22 located on the polyimide. This can be done either by conventional ball or wedge wire bonding techniques, or by using conductive epoxy. Another possibility is to design the interconnects 22 such that they terminate directly onto the bond pads of the sensor 12. This effectively eliminates the need for wire bonding. However, for this to be possible, step coverage of metal must be deposited over the polyimide-silicon interface.

The second stage involves overall packaging of the folded structure. As mentioned above, all traces 22 terminate at the bottom of the structure 10 to enable flip-chip packaging. This allows for the cube to be directly mounted to a PCB, minimizing the necessary footprint area when integrated into a larger device. However, it might be necessary for some applications to be able to replace the folded structure if it fans. For this reason, it is beneficial to place the folded structure into a generic chip package (DIP, can, J-lead package, etc.) By using a socket to attach this type of package, the folded structure can easily be removed and replaced if necessary.

Figure 12:
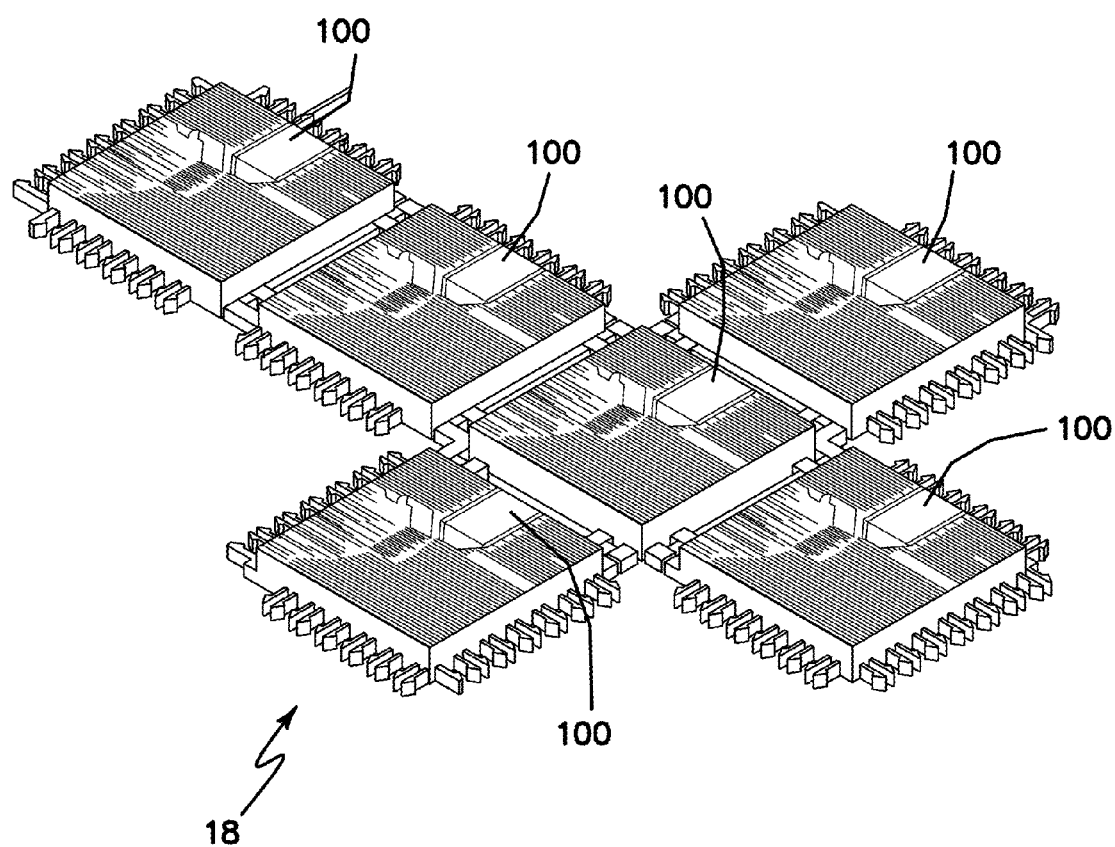
FIG. 12 is a perspective view of a foldable MEMS sensor structure including silicon CMOS caps assembled onto an unfolded sensor be.

On-chip vacuum packaging is implemented to seal all vibratory devices at sub-mTorr vacuum with a cap 100 (or optionally a flip-chip bonded silicon cap integrated with CMOS circuitry, FIG. 12) and getter material, providing both font-end signal processing and enabling Q-factors of $10^6$ for high-performance inertial sensing and timing. These high-aspect-ratio single axis sensors 12 created with all methods described above are also inherently superior in suppressing cross-axis sensitivity.

Figure 13:
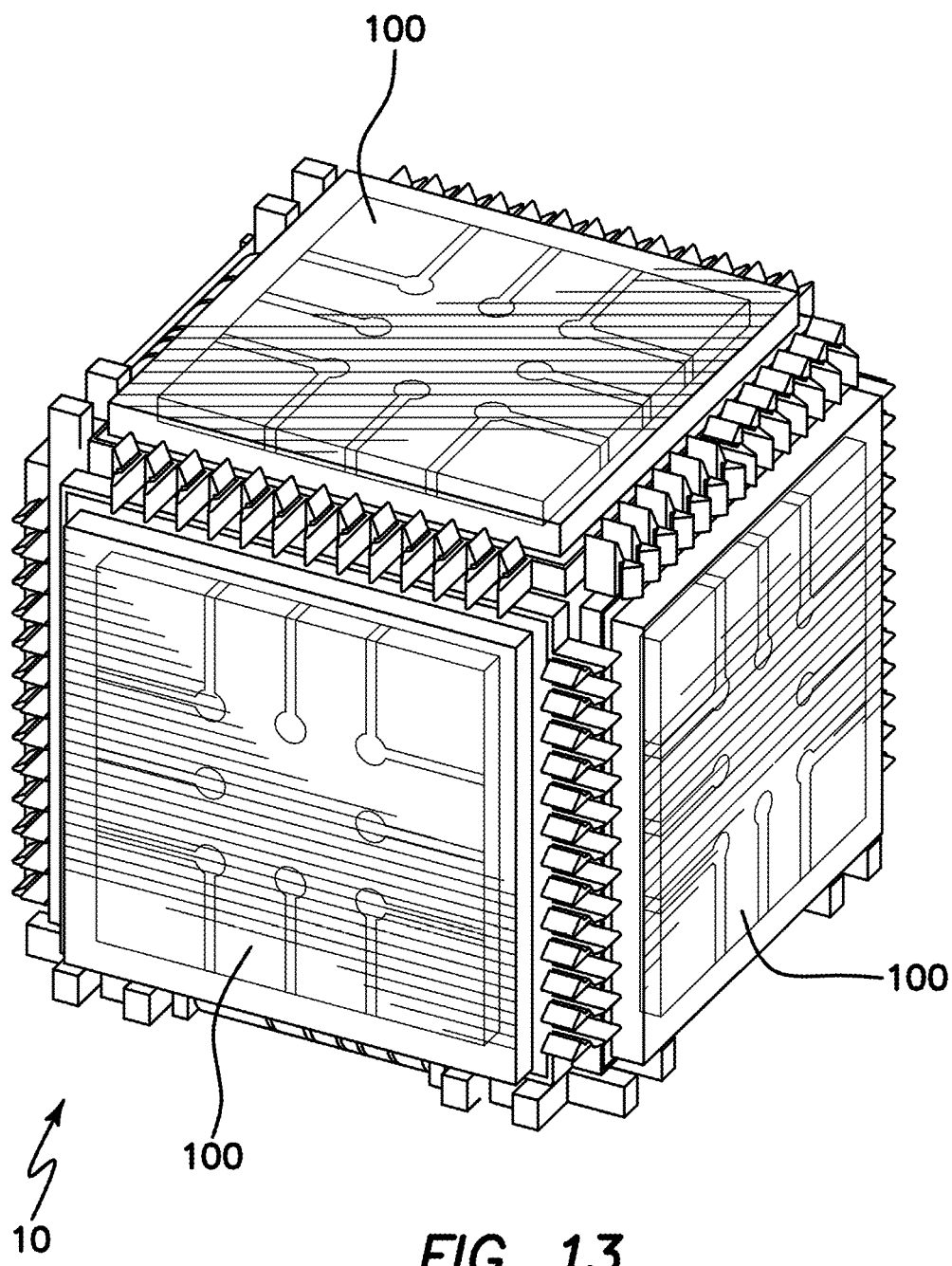
FIG. 13 is a perspective view of the folded structure formed from the foldable structure of FIG. 12 with wafer-level vacuum sealed sensors.

Vacuum packaging and sealing of the devices must also be done to optimize individual sensor performance and also provide protection from the environment. Each sensor 12 may be located either on the inside or outside of the structure 10, or both, depending on the application objectives. The devices inside the structure 10 can be vacuum packaged by sealing the enclosure at the required level of pressure. An sensors 12 will be affected uniformly, which is advantageous if each is identical. However if the sensors 12 differ they might require different levels of vacuum for optimal performance. For example, MEMS gyroscopes require high vacuum to minimize damping, however MEMS accelerometers (non-resonant type) require little or no vacuum to provide damping, thus increasing bandwidth. To provide variable levels of vacuum, a sealing cap 100 with getters are used to enable Q-factors of $10^6$ for high-performance sensing as shown in FIG. 13. Additionally, the cap 100 can be integrated with CMOS electronics to provide front-end signal processing. The lids of caps 100 are applied prior to assembly of the structure 10, and utilize different eutectic compositions for each vacuum level needed. High vacuum devices are to be packaged first by using a eutectic solder preform with a melting temperature higher than that of the remaining vacuum sealing processes. This ensures that vacuum packaging of the first devices will not be adversely affected from reflowing solder preforms for successive devices. This order of packaging also reduces the amount of leakage that could occur from packaging low vacuum devices first and then exposing them to higher vacuum during reflow. By utilizing this process prior to assembly of the folded structure 10, each sensor 12 is packaged at optimal pressure, and performance is maximized.

Figure 14A:
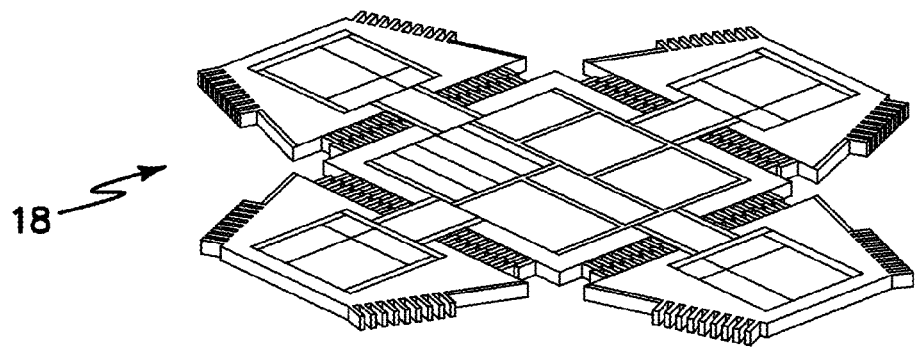
FIGS. 14a-14c are perspective diagrams of a three dimensional folded pyramidal structure with in-situ fabricated and sealed silicon devices, and bonded ASIC chips containing charge amplifiers and A/D converters for the sensors. FIG.
Figure 14B:
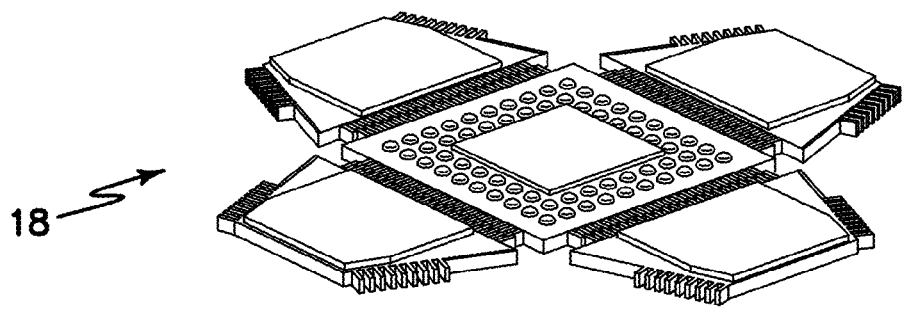
Figure 14C:
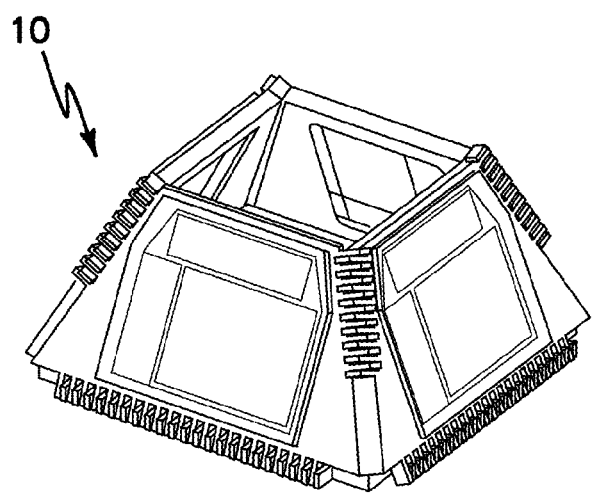

In addition to providing vacuum sealing, the lids 100 can also be equipped with metal leads to connect sensors to the flexible polyimide circuits, or CMOS integrated circuitry to allow for co-located signal processing electronics. The CMOS components can be provided on either the inside or outside of the lid, depending on the requirements of the specific application as shown in FIGS. 14a-14c. FIG. 14a is the inside surface of the flat structure 18, FIG. 14b is the outside surface of the same flat structure 18 and FIG. 14c shows the flat structure after it has been folded into the three dimensional structure 10. Thus, FIG. 14c shows a folded pyramid structure with in-situ fabricated and sealed silicon devices, and bonded ASIC chips containing signal detection circuitry for the sensors on both the inside and outside surfaces. Through-wafer vias can also be created, and can be implemented into the overall fabrication process of the lids. This will allow for the sensor signals to pass through the lid, connecting to bond pads that correspond to the sensor anchors. To provide a connection medium between the sensor 12, the electrical traces 22 on the structure 10, and the lid itself, many methods can be used. Solder bumping can be done to the lid such that the sensor anchors make contact with the traces or vias on the lid, and then the solder can be reflowed to provide a permanent connection. Conductive epoxy can also be used in place of the solder bumping by depositing epoxy dots onto all bond pads, then curing the epoxy once the lid is in place. Advantages of this process is a lower-temperature cure compared to solder reflow, and also can be bonded to any conductive material, whereas solder requires a metal interface that allows wetting during reflow.

Fabrication was done using the process described previously in FIGS. 9a-9j, using an SOI wafer 16 with a 50 µm device layer 28, a 5 μm buried oxide layer 26, and a 500 μm handle layer 24. Silicon dioxide layer 60 is deposited onto the wafer 16 at a thickness of 1.5-2 μm to provide enough masking material to survive DRIE etching of 50 μm of silicon. Sensor patterns were successfully etched into the oxide with minimum feature and trench size of 5 μm using AZ P4620 photoresist as a mask. To remove the photoresist after completion, acetone is used to dissolve the bulk of the material followed by oxygen plasma aching to remove the remaining residue. The type of polyimide layer 64 deposited is HD-4110, commercially available from HD Microsystems, which can be patterned lithographically and provides a thickness of up to 25 μm after curing. On top of the polyimide layer 64, metal 22 is deposited using a 500 Å chrome seed layer followed by a 5000 Å of gold. To pattern the metal 22, a lift-off procedure is done using AZ nLoF 2035 photoresist, a negative resist specifically designed for lift-off processing. After deposition of metal 22, approximately 10 μm of AZ P4620 photoresist 66 is used to mask the areas of the wafer except where the sensors 12 are located. The 50 μm device layer 28 is then etched down to the buried oxide layer 26 using DRIE to define the high aspect ratio sensor features and the photoresist 66 is removed, completing the front side processing.

To protect the front side features during backside processing, a thick layer 68 of AZ P4620 (~15 μm) is first applied conformally over the entire wafer 16. A layer of low-tack or releasable dicing tape 70 is then applied on top of the photoresist 68 for added protection. Because the backside through-etch process results in releasing the unfolded structures from the wafer, a handle wafer (not shown) must be applied to the front side. This prevents the folded structures from being prematurely released while etching the backside of the substrate. The handle wafer is applied using thermal paste as an adhesive, and once complete, the sample is ready for the through-etch process. Photoresist (AZ P4620) is applied to the backside of the wafer 16 using a similar recipe as before, however two layers are used to withstand the amount etching needed to remove a total of 550 μm of silicon and 5 μm of oxide. As before, DRIE etching is used to etch the silicon layers 24, 28. For the oxide layer 26, dry etching is done using a recipe that is selective against photoresist and silicon. To remove the structures from the wafer 16 after fabrication, the samples are placed in acetone until the majority of the photoresist is dissolved, making it easy to extract the foldable structures 18.

Prior to assembling the structures 10, the sensors 12 must be released by etching the buried oxide layer 26 underneath the proof masses. Buffered oxide etch (BOE) is used to dissolve the oxide 26, which is gentle on polymers such as polyimide or photoresist. For additional protection, a photoresist mask is used to cover the polyimide areas 64, eliminating the possibility of damage from the acid. After the sensors 12 have been successfully released, the structures 10 can be packaged and assembled. Cube and pyramid shapes have successfully been created, both having a footprint of less than 1 cm², as shown in FIG. 15.

A major concern with developing any IMU is rigidity of the enveloping structure 10. After initial calibration, misalignments from impact or high acceleration loads will cause errors in the signal. Conventionally this is addressed by using threaded fasteners or heavy-duty solder joints to mount the individual PCB's or sensor units. For the folded IMU cube 10, however, these techniques are not convenient. Therefore other methods are disclosed here. To lock the sidewalls 46 in place after assembly, interlocking latches 48 are provided along the edges of each sidewall 46. This type of design allows for a maximum number of latches 48 to provide rigidity and aid in aligning the sidewalls 46 during assembly. To initially test structural rigidity, vibration testing has been conducted on samples using a vertical shaker unit. Harmonic oscillations were induced from 20-50,000 Hz, resulting in no damage to the structure. This shows that it is feasible for the interlocking latches 48 to provide stability. However, to insure stability under impact and high acceleration loads, it is desired to bond the sidewalls 46 together to enhance structural rigidity. However, materials used for bonding will inevitably have different thermal expansion properties than that of silicon. Under large temperature variations, this could induce stress to the structure 10, resulting in misalignment of sensors 12 or damage to the structure 10 itself.

Figure 16:
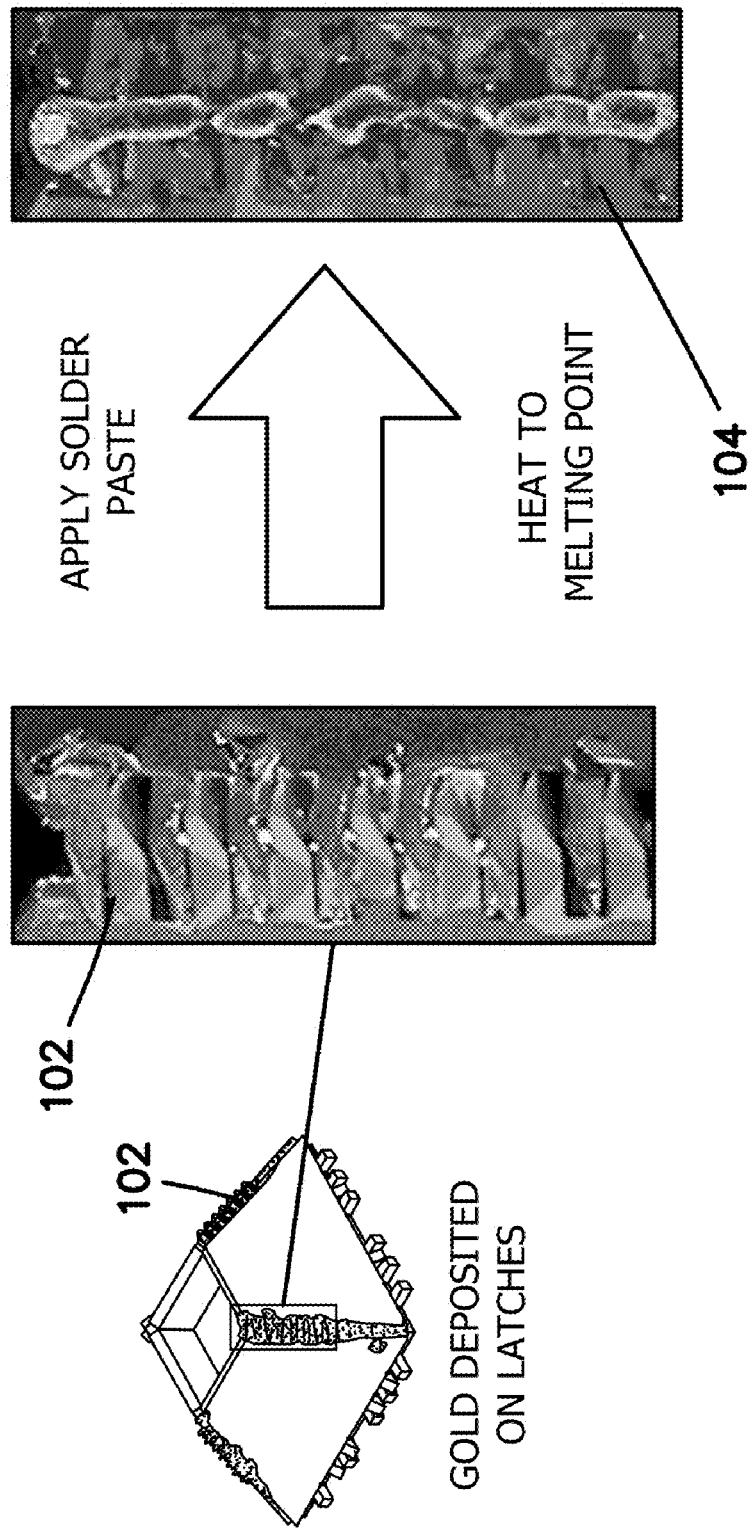
FIG. 16 is a series of microphotographs illustrating the eutectic soldering reinforcement process of an IMU pyramid with the left most portions showing an enlarged close up view of the assembled latch with solder paste inserted and the joint after soldering.

Eutectic soldering is explored to provide structural reinforcement of the folded MEMS structures 18. Soldering of the latches 48 is done to utilize the opportunity of a low-temperature process for significantly increasing rigidity. To enable eutectic solder reinforcement, metal such as gold must be deposited onto the bonding area 102 that will accept wetting of the solder. Solder paste or traditional solder is then applied onto the gold-plated latches 48 to create a rigid metal bond 104 between each sidewall 46. Solder paste can be applied at room temperature, followed by heating the entire structure 10 to above the melting point of the solder paste as depicted in the enlarged microphotographs of FIG. 16. Alternatively, the structure can be heated first, and traditional solder can then be applied to the latches 48. Solder composition can also be selectively electroplated prior to assembly, followed by a solder reflow step.

Figure 17:
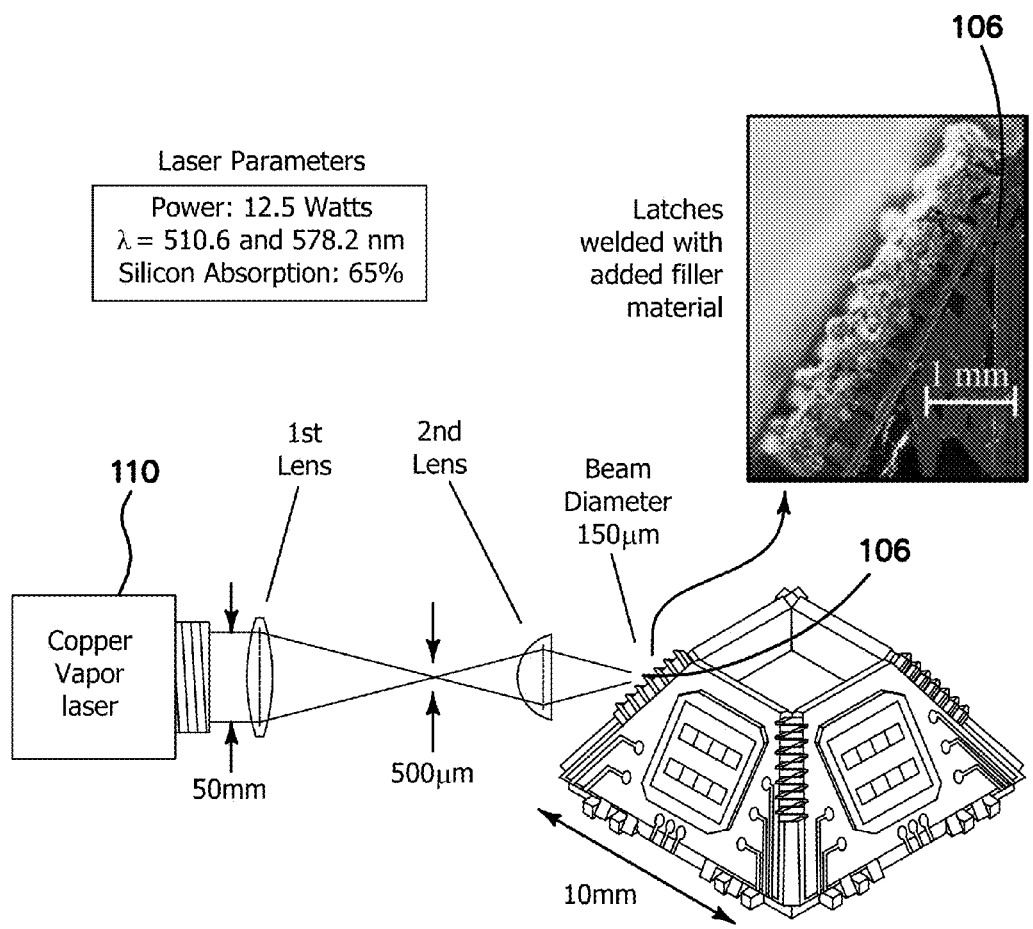
FIG. 17 is a diagram illustrating the reinforcement process of an IMU pyramid using a laser weld.

Silicon welding is also explored to provide a method for maximizing rigidity by creating permanent silicon joints 106 along the sidewall edges. Advantages of this approach are the lack of variation in thermal properties due to different materials, as well as overall rigidity of the folded structure 10. On a macro scale, the two general methods generally used for welding are resistive and laser welding. Resistive welding is the most common technique, using a DC current applied through the weld joint to melt the substrate and provide a permanent connection. Similarly, laser welding as diagrammatically depicted in FIG. 17 heats the welding joint 106 locally to melt the substrate. Laser welding of silicon is illustrated in FIG. 17 utilizing a copper vapor laser 110 at a power of 23 watts and a beam size of 150 μm. Both resistive and laser welding methods can be employed. Glass backbone structures can also be fused together by these means for improved rigidity.

To compare epoxy bonding to silicon fusion, folded MEMS IMU pyramids 10 were reinforced using each technique. An advantage of epoxy bonded sidewalls 46 is greater damping between sidewalls and results in minimal mechanical crosstalk between neighboring sensors 12. Laser-induced silicon fusion produces high rigidity for gun-hard applications, as well as minimal stress from thermal expansion due to the entire platform being comprised of a uniform material. Because the fusion process results in some vaporized material, filler material such as silicon or Pyrex® powder manufactured by Corning Inc. of New York can be added prior to welding as shown in the enlarged inset in FIG. 17.

Sensor structures 12 were reinforced with epoxy bonding and soldering of the sidewall interfaces. Epoxy reinforcement was done by applying adhesive to the latches 48 while the structure 18 is unfolded, and then folding the sidewalls 46 together, followed by epoxy curing. Soldering was also investigated by providing metallic bonds between folded sidewalls 46 for further rigidity enhancement. Solder paste was applied to metalized latches 48 before assembly and reflowed after folding by heating the structure 10 above the solder melting point.

Figure 18:
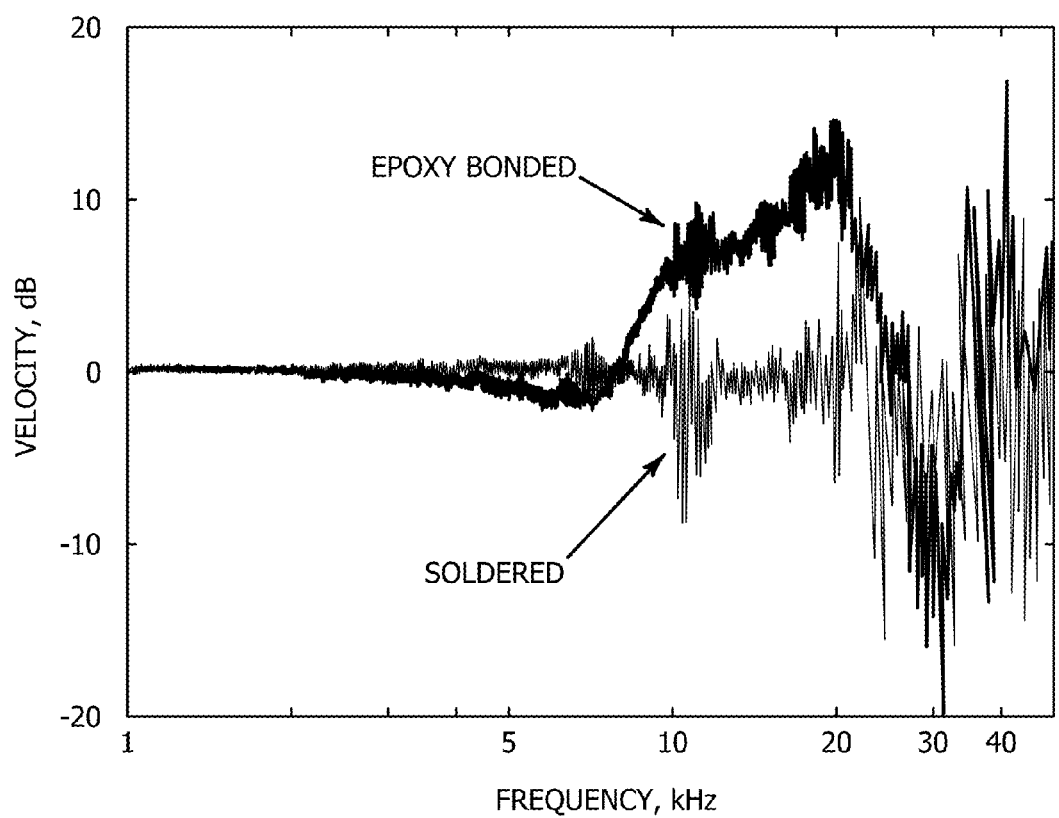
FIG. 18 is a graph of velocity versus frequency showing a laser vibrometer measurement of the frequency response of a three dimensional folded IMU having epoxy bonded sidewalls and solder bonded sidewalls in which no resonances up to 10 kHz are detected.

Frequency responses of the three dimensional folded IMU structures 10 were measured using a wide frequency range vibration calibration system SPEKTRA CS18 VLF/HF equipped with a Polytec® laser vibrometer manufactured by Polytec GmbH of Germany. First resonant modes were observed in the epoxy bonded IMU pyramids around 10 kHz as shown in the graph of FIG. 18. In contrast, the soldered three dimensional IMUs 10 did not exhibit any resonant modes up to 20 kHz. These results suggest feasibility of both reinforcement methods, with soldering providing superior rigidity to the three dimensional folded structures.

Figure 19A:
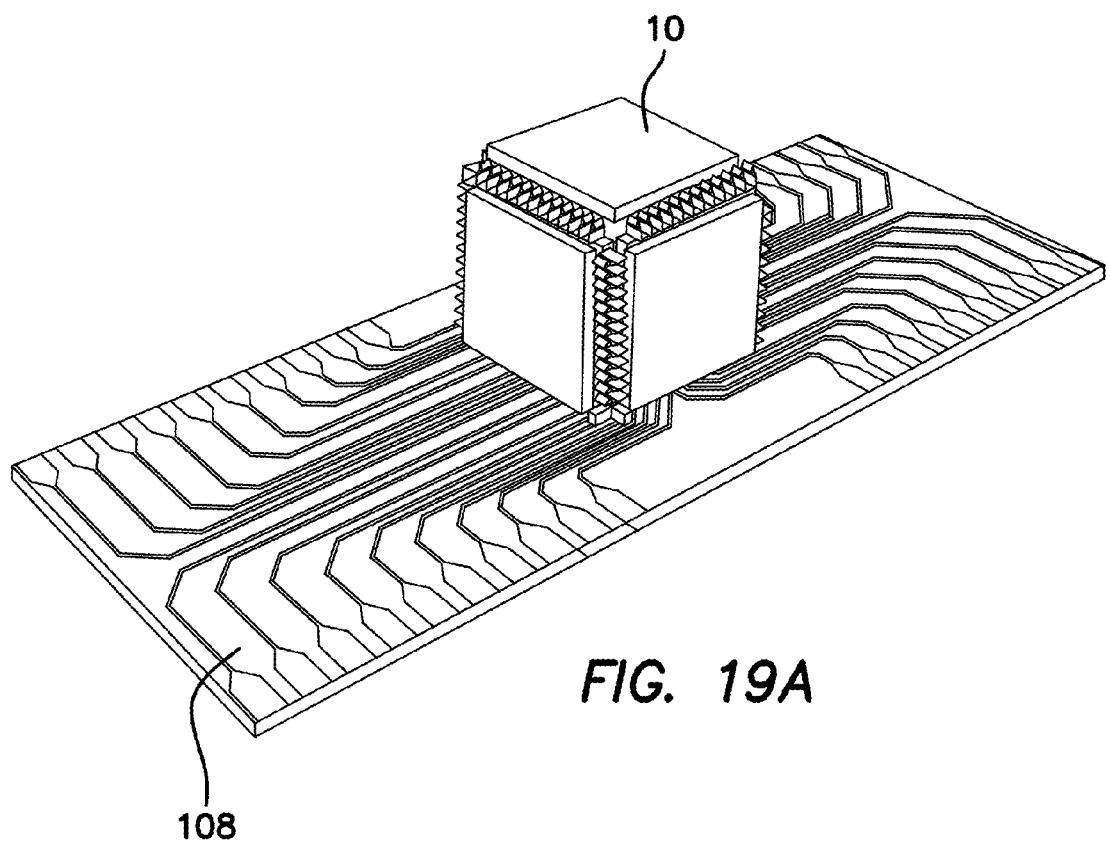
FIG. 19a is a photograph showing a folded IMU flip-chip bonded to an interconnect plate.
Figure 19B:
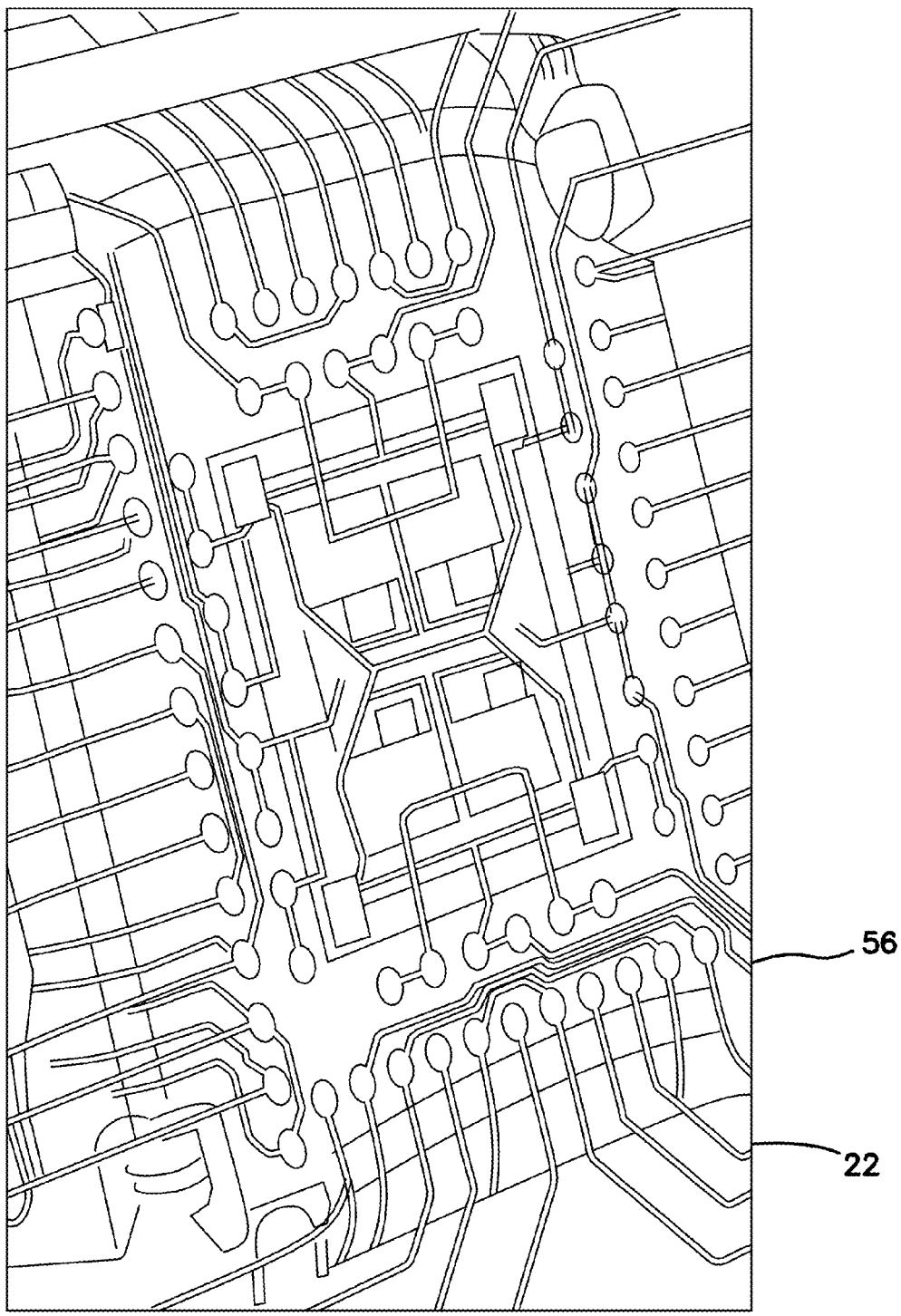

Wire bonding of the sensors 12 to the interconnects 22 is done using a silver conductive epoxy that when cured, creates good electrical conductivity between the sensor anchors and the polyimide bond pads. Because current wire bonding machines not having three dimensional capabilities, attachment of the wires must be completed while the structure 18 is flat, prior to assembly. To prevent damage to the wire bonds while assembling the structure 10, they are reinforced with epoxy. Design of the folded structures 10 allows for direct packaging onto a PCB. However for testing purposes, an interconnect plate was designed and fabricated. Flip-chip bonding of the plate to the bottom of the cube 10 is done using the same process as used for the glass encapsulation lids. Results indicate that alignment of the corresponding bond pads 56 located on the sensor 12 and the interconnect plate 108 is achieved as shown in the photographs of FIGS. 19*a* and 19*b*.

Due to the modularity of the folded IMU design, many different sensors 12 can be used. The SOI device fabrication process of FIGS. 9*a*-9*j* described above utilizes a 50 μm device layer 28 with a 10:1 aspect ratio for etch trenches. Various designs of accelerometers and gyroscopes can be implemented using this procedure, adhering to requirements for different applications. Many different sensors 12 have been successfully fabricated with this process independent from the folded structure 10.

Figure 20:
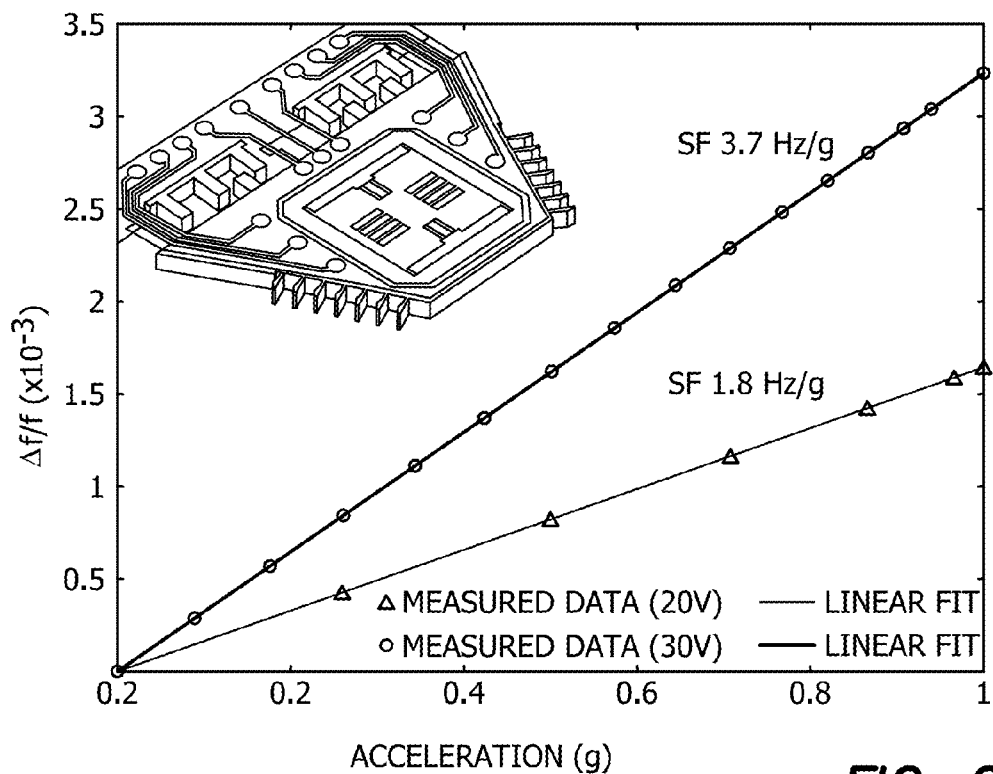
FIG. 20 is a graph of the sensitivity Δf/f versus acceleration of an accelerometer using resonant detection with a tunable scale factor with a perspective depiction of the accelerometer shown in the inset in the upper left corner of the graph.
Figure 21:
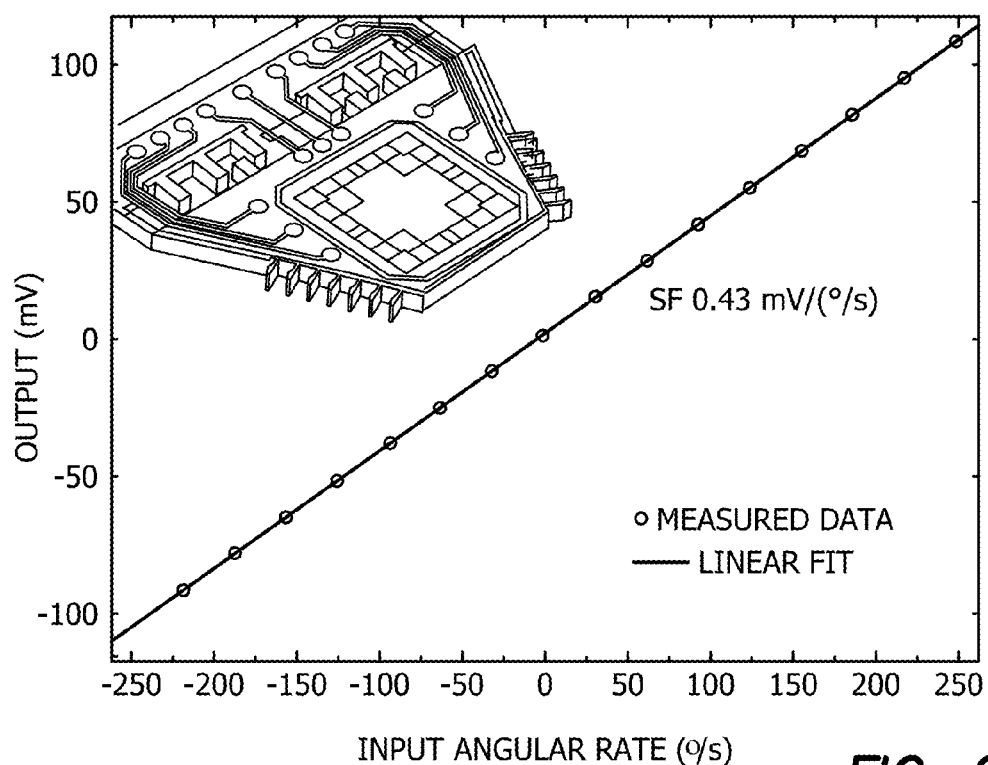
FIG. 21 is a graph of the output in mV versus input angular rate of the accelerometer of FIG. 20, shown in the inset in the upper left corner of the graph.

One type of accelerometer is shown in FIG. 20 with its corresponding response curves. Sensitivity of the sensor 12 can be actively changed by modifying electrostatic tuning combs to induce various levels or pre-tension during operation. Angular rate performance of the gyroscope fabricated on the sidewall 46 of a pyramid 10 is experimentally characterized in air. To test rotation response, the pyramid structure 10 is mounted to a computer controlled Ideal Aerosmith 1291 BR rate table. The drive mode of the gyroscope is excited at resonance using a combination of 30 VDC bias and 5 VAC driving signal applied to the anchored drive-mode electrodes. Separation of the useful signal from the feed-through signal is accomplished using electromechanical amplitude modulation (EAM), where a carrier voltage of 3.5 Vrms at 52 kHz is applied to the proof mass resulting in the amplitude modulation of the motional signal. Two demodulations, first at the carrier frequency and then at the drive mode frequency, are used to extract the motional signal from the total EAM pickup signal. FIG. 21 shows the detected rate response of the gyroscope fabricated on the folded IMU pyramid 10 with a scale factor of 0.43 mV/(deg/sec) over an input range of ±250°/s, confirming the suitability of the approach.

Figure 23:
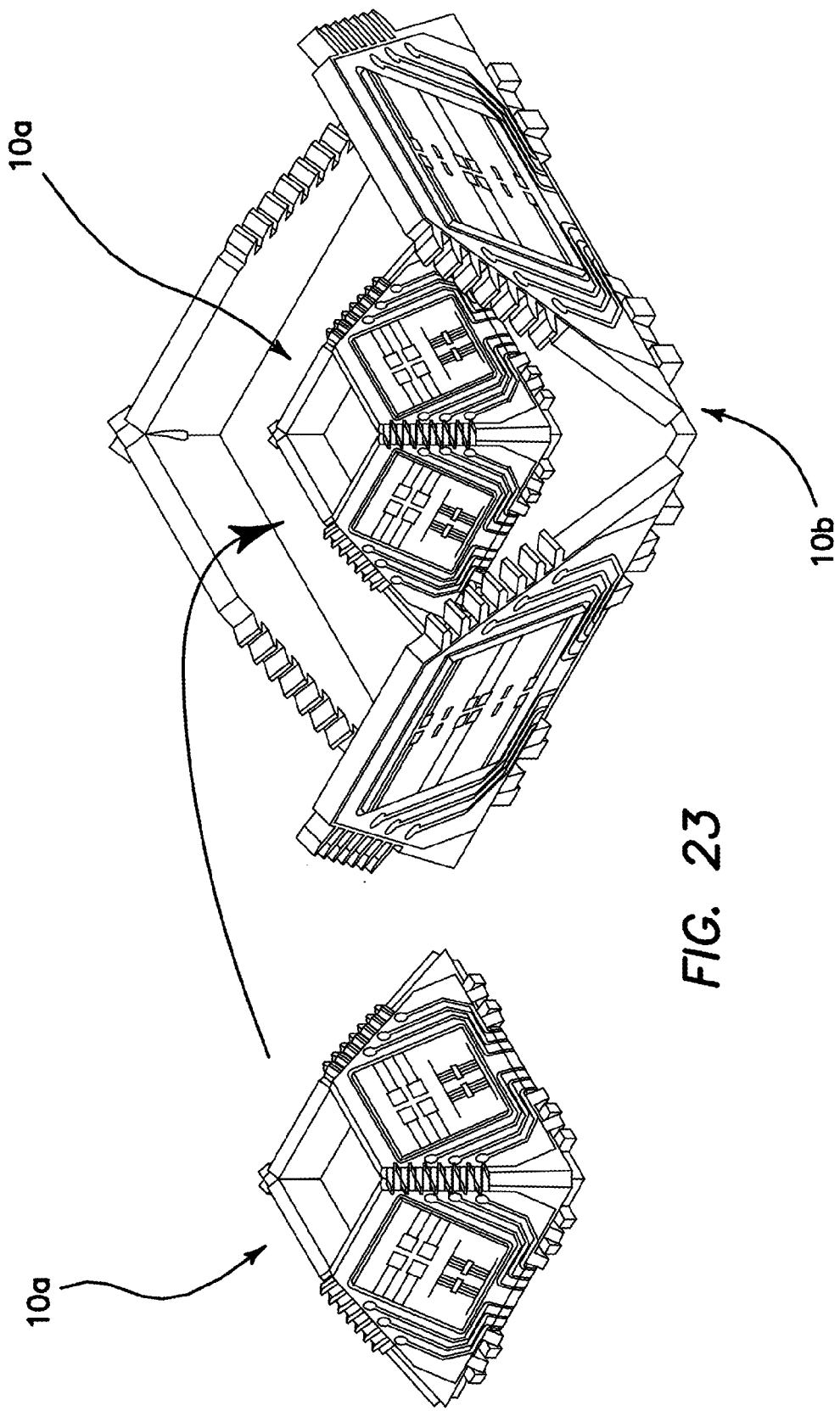
FIG. 23 is a perspective diagram illustrating an embodiment of a smaller polyhedral structure fabricated according to the invention mounted within a larger similarly shaped polyhedral structure fabricated according to the invention.

FIG. 23 is a perspective view of an embedded three dimensional polyhedral structure 10*a*, e.g. a 5 mm×5 mm pyramidal structure, disposed within a larger 11 mm×11 mm pyramidal three dimensional polyhedral structure 10*b*. Structures 10*a* and 10*b* are coupled by at least one electrical interconnect. The embedded three dimensional polyhedral structure 10*a* may include, for example, a sensor or device to provide advanced functionality including self-calibration, detection of multiple phenomena, or additional CMOS signal processing when used in combination with the operation of the devices included on or in the larger structure 10*b*. In the illustrated embodiment, structures 10*a* and 10*b* are shown as the same kind of shape, but this is not a necessary limitation and furthermore, structures 10*a* and 10*b* need not be nested as illustrated, but may be physically combined or connected with each other in any manner desired as may be appropriate for the intended application at hand.

Figure 22:
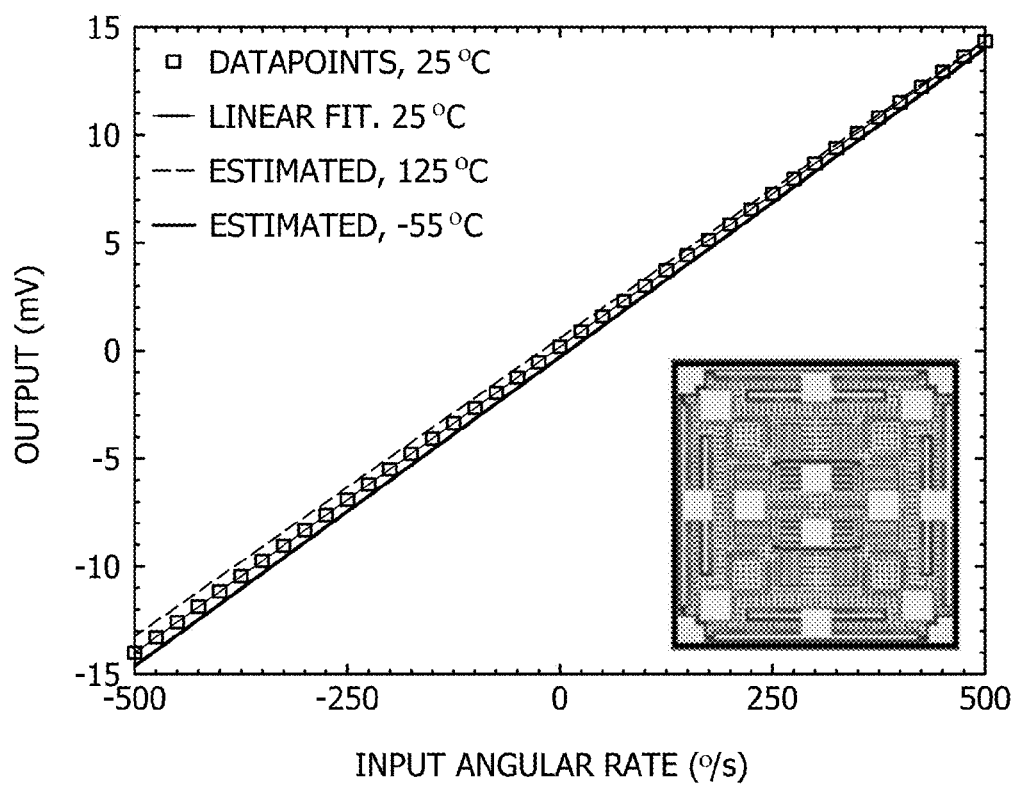
FIG. 22 is a graph of the output in mV versus the input angular rate tested in air at various operational temperatures for another embodiment of a gyroscope design implemented using the folded sensor structure fabrication process of the invention as shown in the inset in the bottom right portion of the graph.

Another example of a gyroscope integrated into the IMU cube 10 is shown in FIG. 22. The device shown is robust to environmental variation in temperature over a broad range. By using a tuning fork design energy transfer to the substrate is minimized, effectively reducing mechanical coupling to other sensors 12 on sidewalls 46. This design is also scalable, allowing for integration into IMUs 10 of various shape and size for many applications.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following invention and its various embodiments.

Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations. A teaching that two elements are combined in a claimed combination is further to be understood as also allowing for a claimed combination in which the two elements are not combined with each other, but may be used alone or combined in other combinations. The excision of any disclosed element of the invention is explicitly contemplated as within the scope of the invention.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. An apparatus comprising:
   a plurality of semiconductor-device substrates and/or MEMS substrates;
   at least one micromachined sensor fabricated on one of the plurality of substrates;
   a plurality of flexible hinges coupling the plurality of substrates into a substantially flat two dimensional foldable assembly; and
   at least one electrical interconnect coupled to the sensor and extending to at least one other one of the plurality of substrates,
   wherein the foldable assembly of substrates is assembled into a three dimensional polyhedral structure with the plurality of substrates are configured in three dimensions to form defined relative orientations in space with respect to each other.

2. The apparatus of claim 1 where the substrates have edges and further comprising latches defined on selected ones of the edges for engaging each other so that the three dimensional polyhedral structure is substantially rigid.

3. The apparatus of claim 1 further comprising at least one integrated circuit fabricated in one of the plurality of substrates.

4. The apparatus of claim 1 wherein the three dimensional polyhedral structure comprises a cube.

5. The apparatus of claim 1 wherein the three dimensional polyhedral structure comprises a pyramidal structure.

6. The apparatus of claim 1 where the substrates have edges and further comprising soldered seams on selected ones of the edges so that the three dimensional polyhedral structure is substantially rigid.

7. The apparatus of claim 1 where the substrates have edges and further comprising fused seams on selected ones of the edges so that the three dimensional polyhedral structure is substantially rigid.

8. The apparatus of claim 1 where the substrates have edges and further comprising epoxied seams on selected ones of the edges so that the three dimensional polyhedral structure is substantially rigid.

9. The apparatus of claim 1 comprising multiple accelerometers or gyroscopes to provide a six-axis inertial measurement unit (IMU).

10. The apparatus of claim 1 wherein at least one of the plurality of substrates is a silicon-on-insulator (SOI) substrate.

11. The apparatus of claim 1 wherein at least one of the plurality of substrates is a silicon-on-glass (SOG) substrate.

12. The apparatus of claim 1 wherein at least one of the plurality of substrates is a dissolved silicon-on-glass (SOG) substrate.

13. The apparatus of claim 1 further comprising a device fabricated with SOI, SOG, or IC techniques where the device includes an accelerometer, gyroscope, transducer, pressure sensor, resonator, signal detection circuit, energy scavenger, a three dimensional microphone or ultrasonic device capable of measuring or sending signals along at least one axis.

14. The apparatus of claim 1 further comprising a vibration isolation system integrally fabricated with the three dimensional polyhedral structure.

15. The apparatus of claim 1 further comprising a vacuum sealing lid disposed on the sensor during fabrication.

16. The apparatus of claim 15 further comprising CMOS integrated circuitry on either the top or bottom of the lid to provide co-located signal processing for the sensor.

17. The apparatus of claim 1 further comprising an embedded three dimensional polyhedral structure fabricated within the three dimensional polyhedral structure, the embedded three dimensional polyhedral structure including at least one sensor or device to provide advanced functionality including self-calibration, detection of multiple phenomena, or additional CMOS signal processing.

18. A method comprising:
    fabricating at a wafer level a plurality of semiconductor devices and/or MEMS substrates wherein at least one micromachined sensor is fabricated on one of the plurality of substrates, wherein a plurality of flexible hinges coupling the plurality of substrates into a substantially flat two dimensional foldable assembly is fabricated; and wherein at least one electrical interconnect coupled to the sensor and extending to at least one other one of the plurality of substrates is fabricated; and
    folding the plurality of substrates into a three dimensional polyhedral structure with the plurality of substrates being configured in three dimensions to form defined relative orientations in space with respect to each other.

19. The method of claim 18 where fabricating and folding the plurality of substrates into a three dimensional polyhedral structure comprises providing multiple accelerometers and gyroscopes to provide a chip-level six-axis inertial measurement unit (IMU).

20. The method of claim 18 where fabricating the plurality of substrates into a three dimensional polyhedral structure comprises fabricating a plurality of silicon-on-insulator (SOI) substrates, silicon-on-glass (SOG) substrates or dissolved silicon-on-glass (SOG) substrates.

21. The method of 18 further where the flexible hinges and at least one electrical interconnect are fabricated around the sensor, and released by etching through the entire corresponding substrate in which the sensor is defined.

22. The method of claim 18 further comprising fabricating a plurality of devices with identical techniques into the plurality of substrates to reduce performance variance between devices resulting from fabrication imperfections.

23. The method of claim 18 further comprising fabricating a plurality of sensors in-situ in two or more of the plurality of substrates when configured as the substantially flat two dimensional foldable assembly, so that all the sensors among the plurality of substrates are photolithographically aligned, thereby minimizing output errors.

24. The method of claim 18 where three dimensional polyhedral structure is composed of silicon or compounds of silicon and further comprising silicon-to-silicon welding selected ones of the sidewall edges of the substrates together to maximize rigidity of the structure and prevent thermal expansion effects.

* * * * *